(12) United States Patent
Oda et al.

(10) Patent No.: US 11,870,427 B2
(45) Date of Patent: Jan. 9, 2024

(54) POWER SUPPLY CONTROL DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Kota Oda, Yokkaichi (JP); Masaya Ina, Yokkaichi (JP); Koki Sakakibara, Yokkaichi (JP); Masayuki Kato, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 10 days.

(21) Appl. No.: 17/757,890

(22) PCT Filed: Dec. 9, 2020

(86) PCT No.: PCT/JP2020/045826
§ 371 (c)(1),
(2) Date: Jun. 23, 2022

(87) PCT Pub. No.: WO2021/131698
PCT Pub. Date: Jul. 1, 2021

(65) Prior Publication Data
US 2023/0054739 A1    Feb. 23, 2023

(30) Foreign Application Priority Data
Dec. 26, 2019  (JP) ................... 2019-237424

(51) Int. Cl.
| | | |
|---|---|---|
| H03K 17/06 | (2006.01) | |
| H03K 17/0812 | (2006.01) | |
| H03K 17/687 | (2006.01) | |

(52) U.S. Cl.
CPC ..... *H03K 17/063* (2013.01); *H03K 17/08122* (2013.01); *H03K 17/687* (2013.01); *H03K 2217/0081* (2013.01)

(58) Field of Classification Search
None
See application file for complete search history.

(56) References Cited

U.S. PATENT DOCUMENTS 5,027,250 A * 6/1991 Cini ................. H02H 9/046
361/84
5,126,911 A * 6/1992 Contiero ............ H01L 27/0218
361/84

(Continued)

FOREIGN PATENT DOCUMENTS

| JP | 2008-244487 A | 10/2008 |
|---|---|---|
| JP | 2013-255017 A | 12/2013 |

OTHER PUBLICATIONS

International Search Report, Application No. PCT/JP2020/045826, dated Feb. 9, 2021. ISA/Japan Patent Office.

*Primary Examiner* — Kenneth B Wells
(74) *Attorney, Agent, or Firm* — Honigman LLP

(57) ABSTRACT

A power supply control device controls power supply by switching on or off a first semiconductor switch and a second semiconductor switch that are arranged on a current path. A first diode and a second diode are connected between a drain and a source of the first semiconductor switch and the second semiconductor switch, respectively. Cathodes of the first diode and the second diode are arranged downstream and upstream of the respective anode on the current path. If current flows through the current path even though a micro- (Continued)

computer has given an instruction to switch the first semiconductor switch and the second semiconductor switch off, a first drive circuit switches the first semiconductor switch on.

9 Claims, 18 Drawing Sheets

(56) References Cited

U.S. PATENT DOCUMENTS

| | | | |
|---|---|---|---|
| 5,648,739 A | 7/1997 | Walther et al. | |
| 6,304,422 B1 * | 10/2001 | Sander | H02H 11/003 361/84 |
| 2019/0109479 A1 | 4/2019 | Tsujioka | |
| 2019/0181751 A1 | 6/2019 | Sawano et al. | |
| 2019/0260197 A1 | 8/2019 | Nakaguchi et al. | |

* cited by examiner

LEGEND
A= Microcomputer

LEGEND
A= Microcomputer

LEGEND
A= Microcomputer

LEGEND
A= Microcomputer

POWER SUPPLY CONTROL DEVICE

CROSS-REFERENCE TO RELATED APPLICATIONS

This application is the U.S. national stage of PCT/JP2020/045826 filed on Dec. 9, 2020, which claims priority of Japanese Patent Application No. JP 2019-237424 filed on Dec. 26, 2019, the contents of which are incorporated herein.

TECHNICAL FIELD

This disclosure relates to a power supply control device.

BACKGROUND ART

JP 2019-146414A discloses a power supply control device for controlling the power supply from a battery to a load. In this power supply control device, a first semiconductor switch and a second semiconductor switch are arranged on a current path of current that flows from the battery to the load. The first semiconductor switch and the second semiconductor switch each have two ends between which a parasitic diode is connected. Cathodes of the parasitic diodes of the first semiconductor switch and the second semiconductor switch are located downstream and upstream of the respective anode on the current path. The power supply from the battery to the load is controlled by switching on or off both the first semiconductor switch and the second semiconductor switch.

There is a possibility that the users incorrectly connect a battery such that current flows through the load before the first semiconductor switch and the second semiconductor switch. When a battery is incorrectly connected while the first semiconductor switch is not provided and the second semiconductor switch is off, current flows through the parasitic diode of the second semiconductor switch. If current flows through the parasitic diode of the second semiconductor switch over a long period of time, the temperature of the second semiconductor switch increases to an abnormal temperature, which may cause a failure.

However, according to the power supply control device described in JP 2019-146414A, the first semiconductor switch is provided, and thus, if the first semiconductor switch and the second semiconductor switch are off, current does not flow through the parasitic diode of the first semiconductor switch or the second semiconductor switch, irrespective of whether or not the battery connection is normal.

It is assumed that, in the power supply control device described in JP 2019-146414A, a short circuit occurs between the ends of the second semiconductor switch in a state in which the battery connection is normal and the first semiconductor switch is off. In this case, current flows from the battery through the parasitic diode of the first semiconductor switch, the second semiconductor switch, and the load in that order. If current flows through the parasitic diode of the first semiconductor switch over a long period of time, a failure may occur in the first semiconductor switch as well.

It is an object of the present disclosure to provide a power supply control device in which a short circuit between ends of one of semiconductor switches does not cause a failure in the other semiconductor switch.

SUMMARY

An aspect of the present disclosure is directed to a power supply control device for controlling power supply by switching on or off both a first semiconductor switch and a second semiconductor switch that are arranged on a current path and each have two ends between which a parasitic diode is connected, including: a processing unit configured to perform processing that gives an instruction to switch the first semiconductor switch and the second semiconductor switch on or off and a switching circuit configured to switch the first semiconductor switch on, if current flows through the current path even though the processing unit has given an instruction to switch the first semiconductor switch and the second semiconductor switch off, wherein the cathodes of the parasitic diodes of the first semiconductor switch and the second semiconductor switch are located downstream and upstream of the respective anode on the current path.

Advantageous Effects of the Present Disclosure

According to the present disclosure, a short circuit between ends of a second semiconductor switch does not cause a failure in a first semiconductor switch.

DETAILED DESCRIPTION OF PREFERRED EMBODIMENTS

Figure 1:
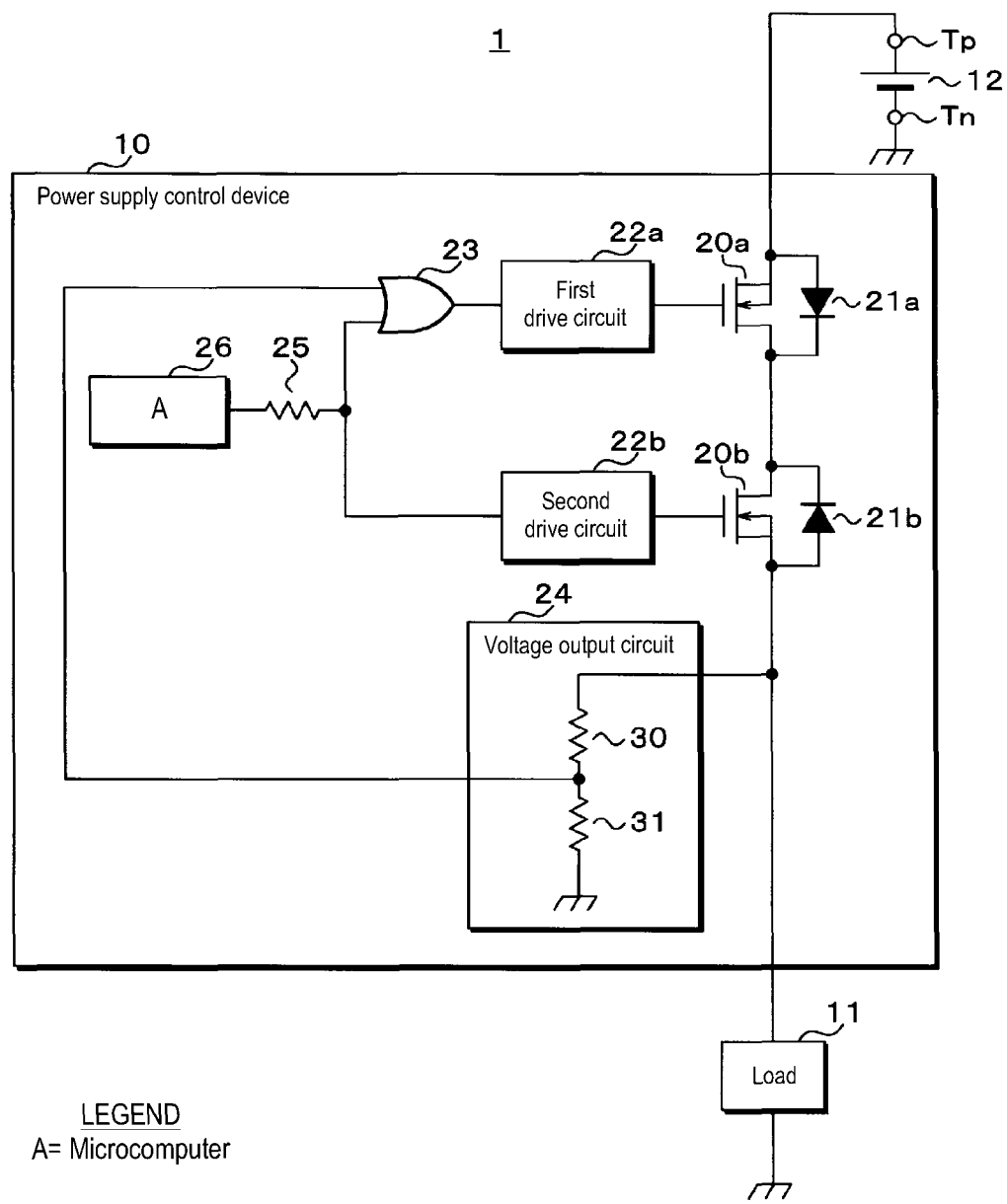
FIG. 1 is a block diagram showing the main configuration of a power source system in Embodiment 1.

First, embodiments of the present disclosure will be enumerated and described. At least portions of the embodiments to be described below may be combined suitably.

First Aspect

A first aspect of the present disclosure is directed to a power supply control device for controlling power supply by switching on or off both a first semiconductor switch and a second semiconductor switch that are arranged on a current path and each have two ends between which a parasitic diode is connected, including: a processing unit configured to perform processing that gives an instruction to switch the first semiconductor switch and the second semiconductor switch on or off and a switching circuit configured to switch the first semiconductor switch on, if current flows through the current path even though the processing unit has given an instruction to switch the first semiconductor switch and the second semiconductor switch off, wherein the cathodes of the parasitic diodes of the first semiconductor switch and the second semiconductor switch are located downstream and upstream of the respective anode on the current path.

According to the first aspect, when a short circuit occurs in the second semiconductor switch, if an instruction is given to switch the first semiconductor switch and the second semiconductor switch off, only the first semiconductor switch is switched off. At this time, current flows through the parasitic diode of the first semiconductor switch. If current flows through a current path even though an instruction has been given to switch the first semiconductor switch and the second semiconductor switch off, a short circuit is deemed to have occurred between the ends of the second semiconductor switch, and the first semiconductor switch is switched on. Accordingly, current does not flow through the parasitic diode of the first semiconductor switch over a long period of time, and thus a short circuit between ends of the second semiconductor switch does not cause a failure in the first semiconductor switch.

Second Aspect

A second aspect of the present disclosure is directed to the power supply control device, wherein the first semiconductor switch is arranged upstream of the second semiconductor switch on the current path, a load is arranged downstream of the second semiconductor switch on the current path, and if a node voltage at a connection node between the second semiconductor switch and the load is greater than or equal to a threshold voltage even though the processing unit has given an instruction to switch the first semiconductor switch and the second semiconductor switch off, then the switching circuit switches the first semiconductor switch on.

According to the second aspect, current flows from the positive electrode of the DC power source through the first semiconductor switch, the second semiconductor switch, and the load in that order. When a short circuit occurs between the ends of the second semiconductor switch in a state in which the first semiconductor switch is off, current flows through the parasitic diode of the first semiconductor switch, the second semiconductor switch, and the load in that order, and the node voltage matches the voltage at the DC power source or a value close to the voltage at the DC power source. If the node voltage is high even though an instruction has been given to switch the first semiconductor switch and the second semiconductor switch off, a short circuit is deemed to have occurred between the ends of the second semiconductor switch.

Third Aspect

A third aspect of the present disclosure is directed to the power supply control device, wherein the first semiconductor switch is arranged downstream of the second semiconductor switch on the current path, a load is arranged downstream of the first semiconductor switch on the current path, and if a node voltage at a connection node between the second semiconductor switch and the load is greater than or equal to a threshold voltage even though the processing unit has given an instruction to switch the first semiconductor switch and the second semiconductor switch off, then the switching circuit switches the first semiconductor switch on.

According to the third aspect, current flows from the positive electrode of the DC power source through the second semiconductor switch, the first semiconductor switch, and the load in that order. When a short circuit occurs between the ends of the second semiconductor switch in a state in which the first semiconductor switch is off, current flows through the second semiconductor switch, the parasitic diode of the first semiconductor switch, and the load in that order, and the node voltage matches the voltage at the DC power source or a value close to the voltage at the DC power source. If the node voltage is high even though an instruction has been given to switch the first semiconductor switch and the second semiconductor switch off, a short circuit is deemed to have occurred between the ends of the second semiconductor switch.

Fourth Aspect

A fourth aspect of the present disclosure is directed to the power supply control device, wherein, if an instruction has been given to switch the first semiconductor switch and the second semiconductor switch off, then the processing unit determines whether or not the node voltage is greater than or equal to the threshold voltage, and if it is determined that the node voltage is greater than or equal to the threshold voltage, then the processing unit performs processing that instructs the switching circuit to switch the first semiconductor switch on.

According to the fourth aspect, if the node voltage is high even though an instruction has been given to switch the first semiconductor switch and the second semiconductor switch off, the switching circuit is instructed to switch the first semiconductor switch on.

Fifth Aspect

A fifth aspect of the present disclosure is directed to the power supply control device, wherein the first semiconductor switch is arranged upstream of the second semiconductor switch on the current path, a load is arranged upstream of the first semiconductor switch on the current path, and if a node voltage at a connection node between the load and the second semiconductor switch is below a threshold voltage even though the processing unit has given an instruction to switch the first semiconductor switch and the second semiconductor switch off, then the switching circuit switches the first semiconductor switch on.

According to the above-described aspect, current flows from the positive electrode of the DC power source through the load, the first semiconductor switch, and the second semiconductor switch in that order. When a short circuit occurs between the ends of the second semiconductor switch in a state in which the first semiconductor switch is off, current flows through the load, the parasitic diode of the first semiconductor switch, and the second semiconductor switch in that order, and the node voltage is 0 V or a value close to 0 V. If the node voltage is low even though an instruction has been given to switch the first semiconductor switch and the second semiconductor switch off, a short circuit is deemed to have occurred between the ends of the second semiconductor switch.

Sixth Aspect

A sixth aspect of the present disclosure is directed to the power supply control device, wherein the first semiconductor switch is arranged downstream of the second semiconductor switch on the current path, a load is arranged upstream of the second semiconductor switch on the current path, and if a node voltage at a connection node between the load and the second semiconductor switch is below a threshold voltage even though the processing unit has given an instruction to switch the first semiconductor switch and the second semiconductor switch off, then the switching circuit switches the first semiconductor switch off.

According to the sixth aspect, current flows from the positive electrode of the DC power source through the load, the second semiconductor switch, and the first semiconductor switch in that order. When a short circuit occurs between the ends of the second semiconductor switch in a state in which the first semiconductor switch is off, current flows through the load, the second semiconductor switch, and the parasitic diode of the first semiconductor switch in that order, and the node voltage is 0 V or a value close to 0 V. If the node voltage is low even though an instruction has been given to switch the first semiconductor switch and the second semiconductor switch off, a short circuit is deemed to have occurred between the ends of the second semiconductor switch.

Seventh Aspect

A seventh aspect of the present disclosure is directed to the power supply control device, wherein, if an instruction has been given to switch the first semiconductor switch and the second semiconductor switch off, then the processing unit determines whether or not the node voltage is below the threshold voltage, and if it is determined that the node voltage is below the threshold voltage, then the processing unit performs processing that instructs the switching circuit to switch the first semiconductor switch on.

According to the above-described aspect, if the node voltage is low even though an instruction has been given to switch the first semiconductor switch and the second semiconductor switch off, the switching circuit is instructed to switch the first semiconductor switch on.

Hereinafter, specific examples of the power source system according to embodiments of the present disclosure will be described with reference to the drawings. Note that the present disclosure is not limited to these examples, but is indicated by the appended claims, and is intended to include all modifications within the scope and equivalent meaning of the claims.

Embodiment 1

Configuration of Power Source System 1

FIG. 1 is a block diagram showing the main configuration of a power source system 1 in Embodiment 1. The power source system 1 is preferably installed in a vehicle and includes a power supply control device 10, a load 11, a battery 12, a positive electrode terminal Tp, and a negative electrode terminal Tn. The power supply control device 10 is connected to one end of the load 11 and the positive electrode terminal Tp. The other end of the load 11 and the negative electrode terminal Tn are grounded. The battery 12 is detachably connected by a user between the positive electrode terminal Tp and the negative electrode terminal Tn.

Typically, as shown in FIG. 1, a user connects the positive electrode and the negative electrode of the battery 12 respectively to the positive electrode terminal Tp and the negative electrode terminal Tn. This connection is the normal connection. The power supply control device 10 controls the power supply from the battery 12 to the load 11 by electrically connecting or disconnecting the positive electrode terminal Tp and the load 11. If the connection of the battery 12 is the normal connection, when the power supply control device 10 electrically connects the positive electrode terminal Tp and the load 11, the battery 12 supplies power to the load 11. In a similar case, when the power supply control device 10 electrically disconnects them, the power supply from the battery 12 to the load 11 is stopped.

There is a possibility that a user incorrectly connects the positive electrode and the negative electrode of the battery 12 respectively to the negative electrode terminal Tn and the positive electrode terminal Tp. This connection is the reverse connection. If the connection of the battery 12 is the reverse connection, the power supply control device 10 can stop the power supply from the battery 12 to the load 11.

The load 11 is an electrical device installed in a vehicle, such as a motor that drives a fan. When power is supplied from the battery 12 to the load 11, the load 11 operates. When the power supply from the battery 12 to the load 11 stops, the load 11 stops operating.

Configuration of Power Supply Control Device 10

The power supply control device 10 includes a first semiconductor switch 20a, a second semiconductor switch 20b, a first diode 21a, a second diode 21b, a first drive circuit 22a, a second drive circuit 22b, an OR circuit 23, a voltage output circuit 24, a device resistor 25, and a microcomputer (hereinafter, referred to as a "microcomputer") 26. The first semiconductor switch 20a and the second semiconductor switch 20b are N-channel FETs (field effect transistors). The OR circuit 23 has two input terminals and one output terminal. The voltage output circuit 24 has circuit resistors 30 and 31.

The first diode 21a and the second diode 21b are parasitic diodes of the first semiconductor switch 20a and the second semiconductor switch 20b, respectively. Accordingly, when the first semiconductor switch 20a and the second semiconductor switch 20b are produced, the first diode 21a and the second diode 21b are respectively formed at the first semiconductor switch 20a and the second semiconductor switch 20b. A cathode and an anode of the first diode 21a are respectively connected to a drain and a source of the first semiconductor switch 20a. A cathode and an anode of the second diode 21b are respectively connected to a drain and a source of the second semiconductor switch 20b.

The source of the first semiconductor switch 20a is connected to the positive electrode terminal Tp. The drain of the first semiconductor switch 20a is connected to the drain of the second semiconductor switch 20b. The source of the second semiconductor switch 20b is connected to the one end of the load 11. Gates of the first semiconductor switch 20a and the second semiconductor switch 20b are respectively connected to the first drive circuit 22a and the second drive circuit 22b. The first drive circuit 22a is further connected to an output terminal of the OR circuit 23.

A connection node between the source of the second semiconductor switch 20b and the one end of the load 11 is connected to one end of the circuit resistor 30 of the voltage output circuit 24. The other end of the circuit resistor 30 is connected to one end of the circuit resistor 31. The other end of the circuit resistor 31 is grounded. A connection node between the circuit resistors 30 and 31 is connected to one input terminal of the OR circuit 23. The second drive circuit 22b and the other input terminal of the OR circuit 23 are connected to one end of the device resistor 25. The other end of the device resistor 25 is connected to the microcomputer 26.

In each of the first semiconductor switch 20a and the second semiconductor switch 20b, if the voltage at the gate with respect to the potential of the source is greater than or equal to a constant voltage, the resistance between the drain and the source is sufficiently small. At this time, the first semiconductor switch 20a and the second semiconductor switch 20b are on, and current can flow via the drains and the sources. In each of the first semiconductor switch 20a and the second semiconductor switch 20b, if the voltage at the gate with respect to the potential of the source is below the constant voltage, the resistance between the drain and the source is sufficiently large. At this time, the first semiconductor switch 20a and the second semiconductor switch 20b are off, and current does not flow via the drains and the sources.

The OR circuit 23 outputs a high-level voltage or a low-level voltage to the first drive circuit 22a. When the voltage input from the OR circuit 23 is switched from the low-level voltage to the high-level voltage, the first drive circuit 22a increases the voltage at the gate of the first semiconductor switch 20a with respect to the potential of the ground. Accordingly, in the first semiconductor switch 20a, the voltage at the gate with respect to the potential of the source increases to a voltage greater than or equal to a constant voltage, and the first semiconductor switch 20a is switched on.

When the voltage input from the OR circuit 23 is switched from the high-level voltage to the low-level voltage, the first drive circuit 22a decreases the voltage at the gate of the first semiconductor switch 20a with respect to the potential of the ground. Accordingly, in the first semiconductor switch 20a, the voltage at the gate with respect to the potential of the source decreases to a voltage below the constant voltage, and the first semiconductor switch 20a is switched off.

As described above, the first drive circuit 22a switches the first semiconductor switch 20a on or off in response to the voltage input from the OR circuit 23.

The microcomputer 26 outputs a high-level voltage or a low-level voltage via the device resistor 25 to the OR circuit 23 and the second drive circuit 22b. When the voltage input from the microcomputer 26 is switched from the low-level voltage to the high-level voltage, the second drive circuit 22b switches the second semiconductor switch 20b on as in the case of the first drive circuit 22a. When the voltage input from the microcomputer 26 is switched from the high-level voltage to the low-level voltage, the second drive circuit 22b switches the second semiconductor switch 20b off as in the case of the first drive circuit 22a.

In the description below, the voltage at the connection node to which the voltage output circuit 24 is connected is referred to as "node voltage". In Embodiment 1, the node voltage is a voltage, with respect to the potential of the ground, that is applied to the connection node between the source of the second semiconductor switch 20b and the one end of the load 11. The circuit resistors 30 and 31 of the voltage output circuit 24 divide the node voltage. The voltage divided by the circuit resistors 30 and 31 is input to the OR circuit 23 as an output voltage of the voltage output circuit 24. This output voltage is determined by a ratio between the resistances of the circuit resistors 30 and 31. The resistances of the circuit resistors 30 and 31 have fixed values. If the resistance of the circuit resistor 30 is twice the resistance of the circuit resistor 31, the output voltage of the voltage output circuit 24 is a voltage obtained by dividing the node voltage by 3.

If the output voltage of the voltage output circuit 24 or the microcomputer 26 is greater than or equal to a reference voltage, the OR circuit 23 outputs a high-level voltage to the first drive circuit 22a. If the output voltages of the voltage output circuit 24 and the microcomputer 26 are below the reference voltage, the OR circuit outputs a low-level voltage to the first drive circuit 22a. The reference voltage has a fixed value greater than 0 V and is set in advance. The high-level voltage that is output by the microcomputer 26 is greater than or equal to the reference voltage. The low-level voltage that is output by the microcomputer 26 is below the reference voltage.

The output voltage of the voltage output circuit 24 is proportional to the node voltage. Hereinafter, the node voltage when the output voltage of the voltage output circuit 24 is the reference voltage is referred to as "threshold voltage". Since the reference voltage is greater than 0 V, the threshold voltage is greater than 0 V as well. If the node voltage is below the threshold voltage, then the voltage output circuit 24 outputs a voltage below the reference voltage to the OR circuit 23. If the node voltage is greater than or equal to the threshold voltage, then the voltage output circuit 24 outputs a voltage greater than or equal to the reference voltage to the OR circuit 23.

Operation of Power Supply Control Device 10

Figure 2:
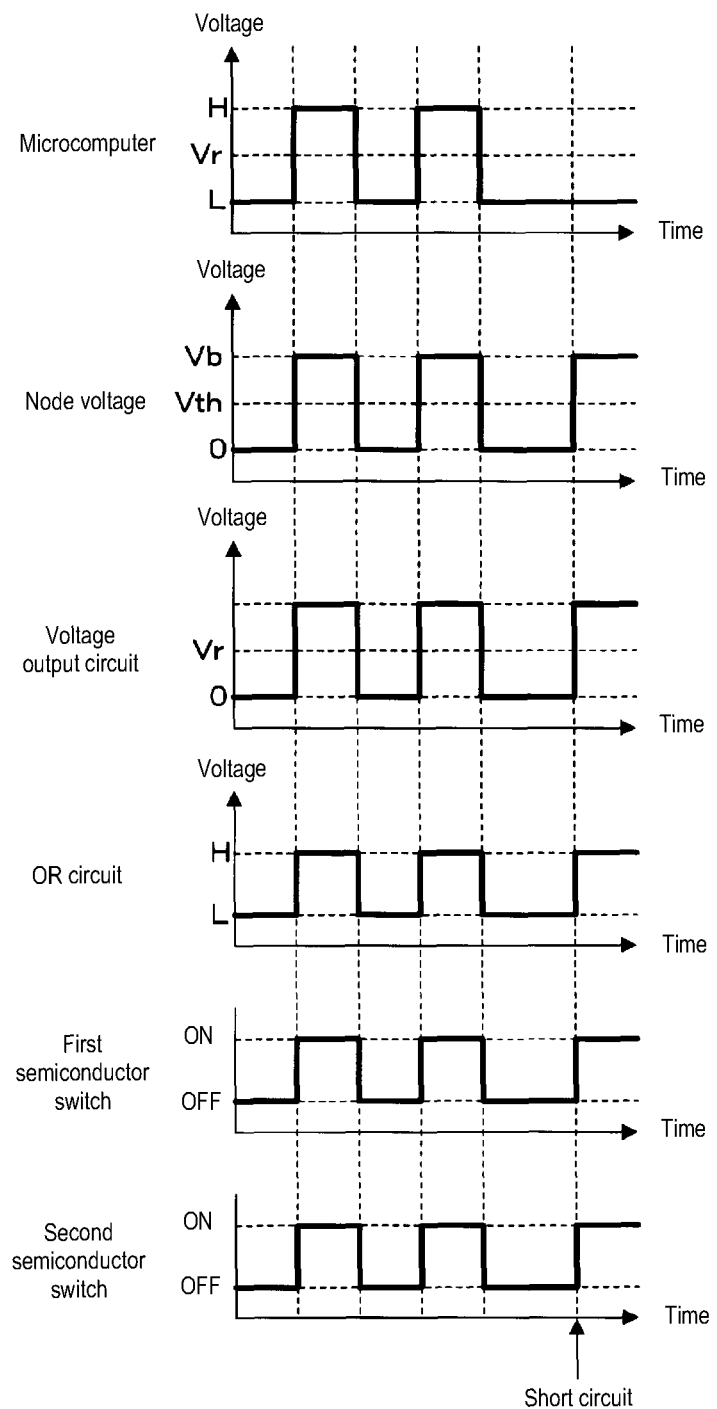
FIG. 2 is a timing chart illustrating an operation of a power supply control device.

FIG. 2 is a timing chart illustrating an operation of the power supply control device 10. FIG. 2 shows graphs of the output voltage of the microcomputer 26, the node voltage, the output voltage of the voltage output circuit 24, the output voltage of the OR circuit 23, and the states of the first semiconductor switch 20a and the second semiconductor switch 20b. The horizontal axes indicate time in these graphs. Hereinafter, the voltage at the positive electrode of the battery 12 with respect to the potential of the negative electrode is referred to as "battery voltage". The battery voltage is greater than the threshold voltage. In FIG. 2, the high-level voltage, the low-level voltage, the reference voltage, the battery voltage, and the threshold voltage are respectively denoted by H, L, Vr, Vb, and Vth. In drawings other than FIG. 2 as well, the high-level voltage, the low-level voltage, the reference voltage, the battery voltage, and the threshold voltage are respectively denoted in a similar manner.

In the description below, it is assumed that the connection of the battery 12 is the normal connection. As shown in FIG. 2, if there is no failure occurring in the power supply control device 10, when the output voltage of the microcomputer 26 is the low-level voltage, the first semiconductor switch 20a and the second semiconductor switch 20b are off. The node voltage and the output voltage of the voltage output circuit are 0 V. The output voltage of the OR circuit 23 is the low-level voltage.

When the microcomputer 26 switches the output voltage from the low-level voltage to the high-level voltage, the OR circuit 23 switches the output voltage to the first drive circuit 22a to the high-level voltage, and the first drive circuit 22a switches the first semiconductor switch 20a on. Furthermore, since the output voltage to the second drive circuit 22b is switched from the low-level voltage to the high-level voltage, the second drive circuit 22b switches the second semiconductor switch 20b on. Accordingly, when the microcomputer 26 switches the output voltage to the high-level voltage, the first semiconductor switch 20a and the second semiconductor switch 20b are switched on.

When the first semiconductor switch 20a and the second semiconductor switch 20b are switched on, the node voltage increases to the battery voltage Vb. Accordingly, the output voltage of the voltage output circuit 24 increases to a voltage greater than or equal to the reference voltage Vr. When the first semiconductor switch 20a and the second semiconductor switch 20b are switched on, the positive electrode terminal Tp and the one end of the load 11 are electrically connected to each other, and the battery 12 supplies power via the first semiconductor switch 20a and the second semiconductor switch 20b to the load 11.

At this time, current flows from the positive electrode terminal Tp through the first semiconductor switch 20a, the second semiconductor switch 20b, the load 11, and the negative electrode terminal Tn in that order. In this manner, the first semiconductor switch 20a, the second semiconductor switch 20b, and the load 11 are arranged in this order on a current path of current that flows from the positive electrode terminal Tp to the negative electrode terminal Tn. The cathodes of the first diode 21a and the second diode 21b are arranged downstream and upstream of the respective anode on the current path.

When the first semiconductor switch 20a is on, the voltage between the drain and the source is substantially 0 V and thus current does not flow through the first diode 21a. In a similar manner, when the second semiconductor switch 20b is on, current does not flow through the second diode 21b.

When the microcomputer 26 switches the output voltage from the high-level voltage to the low-level voltage, the second drive circuit 22b switches the second semiconductor switch 20b off. When the second semiconductor switch 20b is switched off, the flow of current via the load 11 and the flow of current via the circuit resistors 30 and 31 are stopped, and thus the node voltage and the output voltage of the voltage output circuit 24 decrease to 0 V. Accordingly, the two voltages input to the OR circuit 23 are below the reference voltage Vr, and thus the output voltage of the OR circuit 23 is switched to the low-level voltage, and the first drive circuit 22a switches the first semiconductor switch 20a off.

As described above, if there is no failure occurring in the power supply control device 10, when the microcomputer 26 switches the output voltage from the high-level voltage to the low-level voltage, the first semiconductor switch 20a and the second semiconductor switch 20b are switched off. When the first semiconductor switch 20a and the second semiconductor switch 20b are switched off, the positive electrode terminal Tp and the one end of the load 11 are electrically disconnected, and the power supply from the battery 12 to the load 11 is stopped.

When a short circuit occurs between the drain and the source of the second semiconductor switch 20b in a state in which the microcomputer 26 outputs a low-level voltage, current flows from the positive electrode of the battery 12 through the first diode 21a of the first semiconductor switch 20a, the second semiconductor switch 20b, and the load 11 in that order, and the node voltage increases to a value close to the battery voltage Vb and becomes greater than the threshold voltage Vth. Accordingly, the output voltage of the voltage output circuit 24 is greater than or equal to the reference voltage Vr, and the output voltage of the OR circuit 23 is switched from the low-level voltage to the high-level voltage. Accordingly, the first drive circuit 22a switches the first semiconductor switch 20a on, and the flow of current via the first diode 21a is stopped.

As described above, if the microcomputer 26 has given an instruction to switch the first semiconductor switch 20a and the second semiconductor switch 20b off, when a short circuit occurs between the drain and the source of the second semiconductor switch 20b, the first drive circuit 22a switches the first semiconductor switch 20a on.

A short circuit between the drain and the source of the second semiconductor switch 20b means a failure in which the resistance between the drain and the source of the second semiconductor switch 20b is fixed to a small value, irrespective of the voltage at the gate. When a short circuit occurs, current can flow via the drain and the source.

When a short circuit occurs between the drain and the source of the second semiconductor switch 20b in a state in which the microcomputer 26 outputs a high-level voltage, the node voltage does not decrease to a voltage below the threshold voltage Vth even when the microcomputer 26 switches the output voltage to the low-level voltage. Accordingly, even when the output voltage of the microcomputer 26 is switched to the low-level voltage, the OR circuit 23 continues to output the high-level voltage, and the first drive circuit 22a keeps the first semiconductor switch 20a on.

Typically, the battery 12 is connected between the positive electrode terminal Tp and the negative electrode terminal Tn in a state in which the first semiconductor switch 20a and the second semiconductor switch 20b are off. At this time, even when the connection of the battery 12 is the reverse connection, the node voltage and the output voltage of the voltage output circuit 24 are kept at 0 V and the output voltage of the OR circuit 23 is not switched from the low-level voltage to the high-level voltage. Accordingly, in a state in which the first semiconductor switch 20a and the second semiconductor switch 20b are off, current does not flow from the battery 12, irrespective of whether or not the connection of the battery 12 is the normal connection.

Configuration of Microcomputer 26

Figure 3:
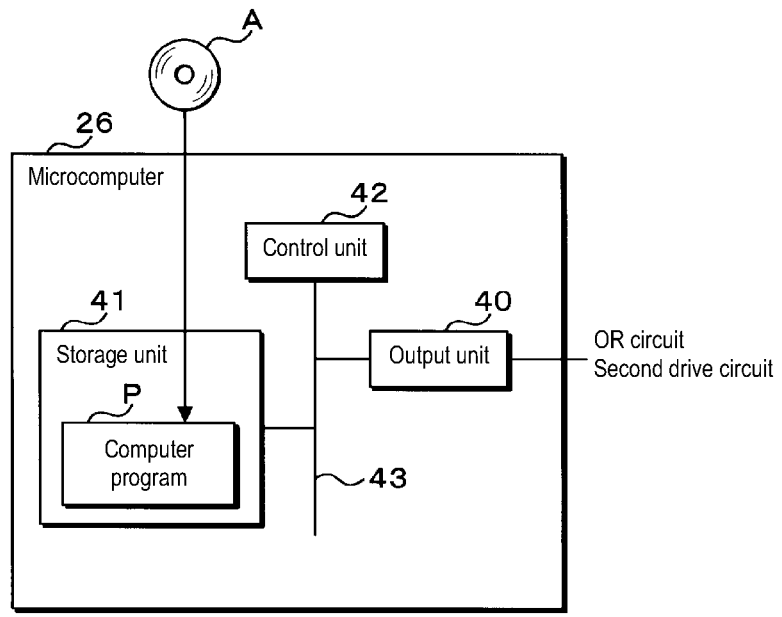
FIG. 3 is a block diagram showing the main configuration of a microcomputer.

FIG. 3 is a block diagram showing the main configuration of the microcomputer 26. The microcomputer 26 includes an output unit 40, a storage unit 41, and a control unit 42. These units are connected to an internal bus 43. The output unit 40 is further connected via the device resistor 25 to the OR circuit 23 and the second drive circuit 22b.

The output unit 40 outputs a low-level voltage or a high-level voltage via the device resistor 25 to the OR circuit 23 and the second drive circuit 22b. The output unit 40 switches the output voltages to the OR circuit 23 and the second drive circuit 22b to the low-level voltage or the high-level voltage according to an instruction from the control unit 42.

The storage unit 41 is a non-volatile memory. The storage unit 41 stores a computer program P. The control unit 42 has a processing element that executes processing, such as a CPU (central processing unit). The processing element of the control unit 42 executes the computer program P, thereby performing power supply control processing that controls the power supply to the load 11.

The computer program P may be stored in a storage medium A so as to be readable by the processing element included in the control unit 42. In this case, the computer program P read by an unshown reading device from the storage medium A is written into the storage unit 41. The storage medium A is an optical disk, a flexible disk, a magnetic disk, a magneto-optical disk, a semiconductor memory, or the like. The optical disk is a CD (compact disc)-ROM (read only memory), a DVD (digital versatile disc)-ROM, a BD (Blu-ray (registered trademark) disc), or the like. The magnetic disk is, for example, a hard disk. Furthermore, the computer program P may be downloaded from an unshown external device connected to an unshown communication network, and the downloaded computer program P may be written into the storage unit 41.

Figure 4:
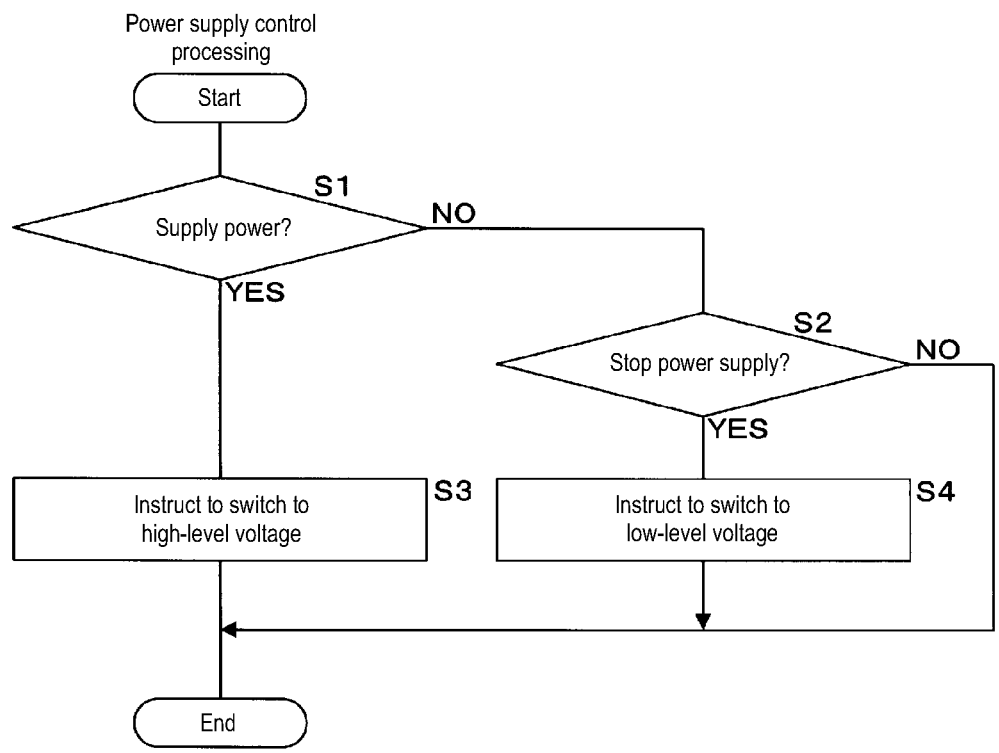
FIG. 4 is a flowchart showing the procedure of power supply control processing.

Furthermore, the number of processing elements included in the control unit 42 is not limited to one, and may be two or more. In this case, a plurality of processing elements may cooperatively perform temperature calculation processing and power supply control processing according to the computer program P Power Supply Control Processing FIG. 4 is a flowchart showing the procedure of power supply control processing. In the description below, it is assumed that the connection of the battery 12 is the normal connection. In the power supply control processing, first, the control unit 42 determines whether or not to supply power to the load 11 (step S1). For example, if an operation signal that gives an instruction to operate the load 11 is input to an unshown input unit, the control unit 42 determines to supply power to the load 11. If such an operation signal is not input to the input unit, the control unit 42 determines not to supply power to the load 11.

If the control unit 42 determines not to supply power (S1: NO), the control unit determines whether or not to stop the power supply to the load 11 (step S2). For example, if a stop signal that gives an instruction to stop the power supply to the load 11 is input to an unshown input unit, the control unit 42 determines to stop the power supply to the load 11. If such a stop signal is not input to the input unit, the control unit 42 determines not to stop the power supply to the load 11. If the control unit 42 determines not to stop the power supply (S2: NO), the control unit ends the power supply control processing. After ending the power supply control processing, the control unit 42 again performs the power supply control processing. Accordingly, the control unit 42 waits until it becomes necessary to supply power to the load 11 or to stop the power supply to the load 11.

If the control unit 42 determines to supply power (S1: YES), the control unit instructs the output unit 40 to switch the output voltage to the high-level voltage (step S3). Accordingly, the output unit 40 switches the output voltages to the OR circuit 23 and the second drive circuit 22b to the high-level voltage. As a result, the first drive circuit 22a and the second drive circuit 22b switch the first semiconductor switch 20a and the second semiconductor switch 20b on, and power is supplied from the battery 12 to the load 11. The control unit 42 performs step S3, thereby instructing the first drive circuit 22a and the second drive circuit 22b to switch the first semiconductor switch 20a and the second semiconductor switch 20b on.

If the control unit 42 determines to stop the power supply (S2: YES), the control unit 42 instructs the output unit 40 to switch the output voltage to the low-level voltage (step S4). Accordingly, the output unit 40 switches the output voltages to the OR circuit 23 and the second drive circuit 22b to the low-level voltage. If a short circuit does not occur between the ends of the second semiconductor switch 20b, when the output unit 40 switches the output voltage to the low-level voltage, the first drive circuit 22a and the second drive circuit 22b switch the first semiconductor switch 20a and the second semiconductor switch 20b off, and the power supply from the battery 12 to the load 11 is stopped.

The control unit 42 performs step S4, thereby instructing the first drive circuit 22a and the second drive circuit 22b to switch the first semiconductor switch 20a and the second semiconductor switch 20b off. The control unit 42 functions as a processing unit.

After performing one of steps S3 and S4, the control unit 42 ends the power supply control processing. As described above, after ending the power supply control processing, the control unit 42 again performs the power supply control processing.

Effects of Power Supply Control Device 10

As described above, the control unit 42 of the microcomputer 26 instructs the output unit 40 to switch the output voltage to the low-level voltage, thereby giving an instruction to switch the first semiconductor switch 20a and the second semiconductor switch 20b off. If the node voltage is greater than or equal to the threshold voltage even though the control unit 42 has given an instruction to switch the first semiconductor switch 20a and the second semiconductor switch 20b off, a short circuit is deemed to have occurred between the drain and the source of the second semiconductor switch 20b, and the OR circuit 23 switches the output voltage to the high-level voltage. Accordingly, the first drive circuit 22a switches the first semiconductor switch 20a on. The node voltage being greater than or equal to the threshold voltage means that current flows through the current path from the positive electrode terminal Tp to the negative electrode terminal Tn.

Since the first drive circuit 22a operates as described above, current does not flow over a long period of time via the first diode 21a, and the temperature of the first semiconductor switch 20a does not increase to an abnormal temperature. A short circuit between the drain and the source of the second semiconductor switch 20b does not cause a failure in the first semiconductor switch 20a. The first drive circuit 22a functions as a switching unit.

Embodiment 2

The configuration of the voltage output circuit 24 is not limited to that shown in Embodiment 1.

In the description below, Embodiment 2 will be described focusing on aspects different from those in Embodiment 1. The aspects of the configuration are similar to those in Embodiment 1 except for the aspects described below. Accordingly, constituent elements similar to those in Embodiment 1 are denoted by the same reference numerals as those in Embodiment 1, and their description has been omitted.

Configuration of Voltage Output Circuit 24

Figure 5:
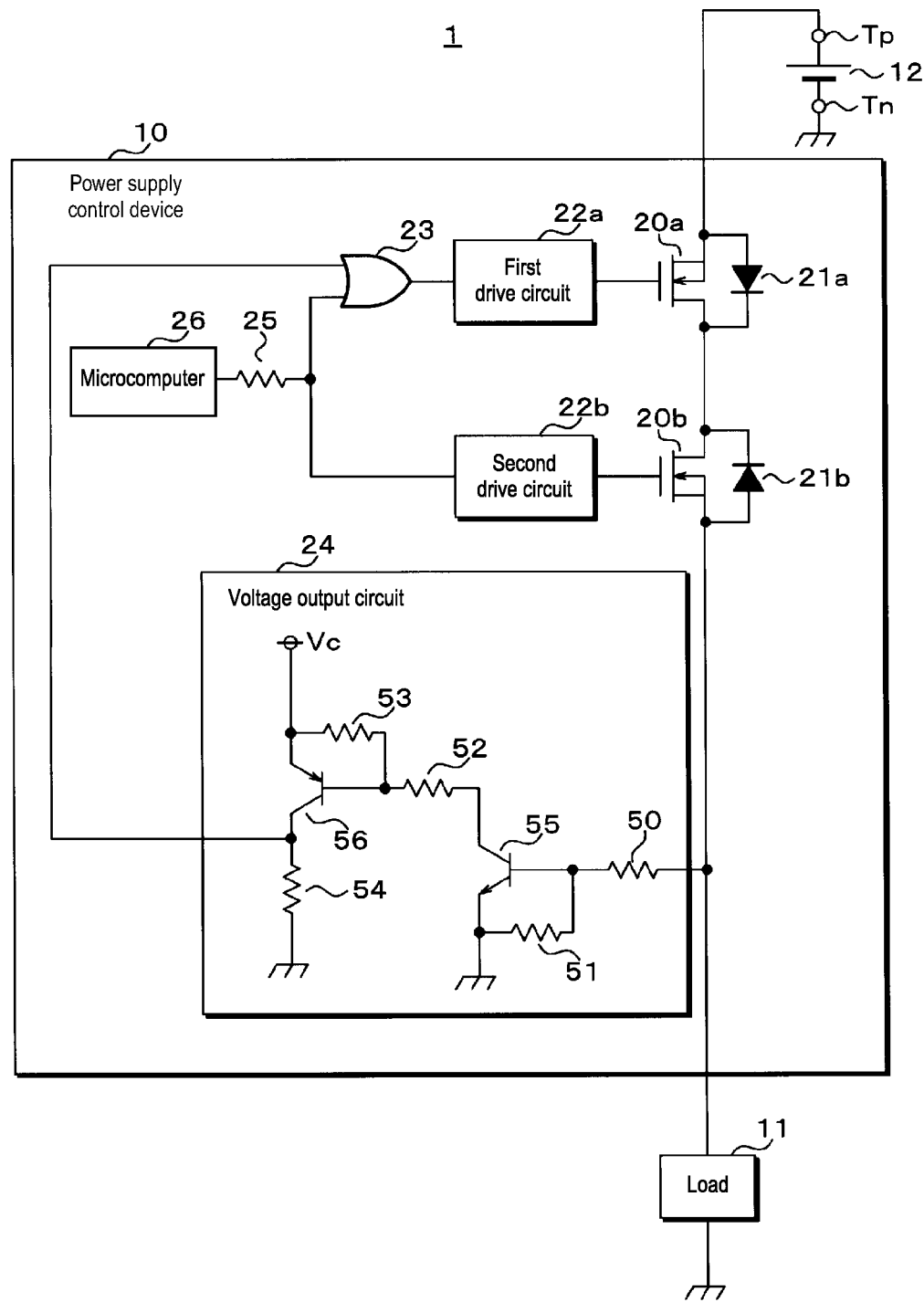
FIG. 5 is a block diagram showing the main configuration of a power source system in Embodiment 2.

FIG. 5 is a block diagram showing the main configuration of the power source system 1 in Embodiment 2. Embodiment 2 is different from Embodiment 1 in the configuration of the voltage output circuit 24. In Embodiment 2, the voltage output circuit 24 includes circuit resistors 50, and 51, . . . , 54, a first circuit switch 55, and a second circuit switch 56. The first circuit switch 55 is an NPN bipolar transistor. The second circuit switch 56 is a PNP bipolar transistor.

One end of the circuit resistor 50 is connected to the connection node between the source of the second semiconductor switch 20b and the one end of the load 11. The other end of the circuit resistor 50 is connected to a base of the first circuit switch 55. The circuit resistor 51 is connected between the base and an emitter of the first circuit switch 55. The emitter of the first circuit switch 55 is grounded. A collector of the first circuit switch 55 is connected to one end of the circuit resistor 52. The other end of the circuit resistor 52 is connected to a base of the second circuit switch 56.

The circuit resistor 53 is connected between the base and an emitter of the second circuit switch 56. A constant voltage Vc is applied to the emitter of the second circuit switch 56. The constant voltage Vc is a voltage with respect to the potential of the ground. A collector of the second circuit switch 56 is connected to one end of the circuit resistor 54. The other end of the circuit resistor 54 is grounded. A connection node between the collector of the second circuit switch 56 and the one end of the circuit resistor 54 is connected to the one input terminal of the OR circuit 23.

In the first circuit switch 55, if the voltage at the base with respect to the potential of the emitter is greater than or equal to a positive constant voltage, the resistance between the collector and the emitter is sufficiently small. At this time, the first circuit switch 55 is on, and current can flow via the collector and the emitter. In the first circuit switch 55, if the voltage at the base with respect to the potential of the emitter is below the positive constant voltage, the resistance between the collector and the emitter is sufficiently large. At this time, the first circuit switch 55 is off, and current does not flow via the collector and the emitter.

In the second circuit switch 56, if the voltage at the base with respect to the potential of the emitter is below a negative constant voltage, the resistance between the collector and the emitter is sufficiently small. At this time, the second circuit switch 56 is on, and current can flow via the emitter and the collector. In the second circuit switch 56, if the voltage at the base with respect to the potential of the emitter is greater than or equal to the negative constant voltage, the resistance between the collector and the emitter is sufficiently large. At this time, the second circuit switch 56 is off, and current does not flow via the collector and the emitter.

Operation of Voltage Output Circuit 24

Figure 6:
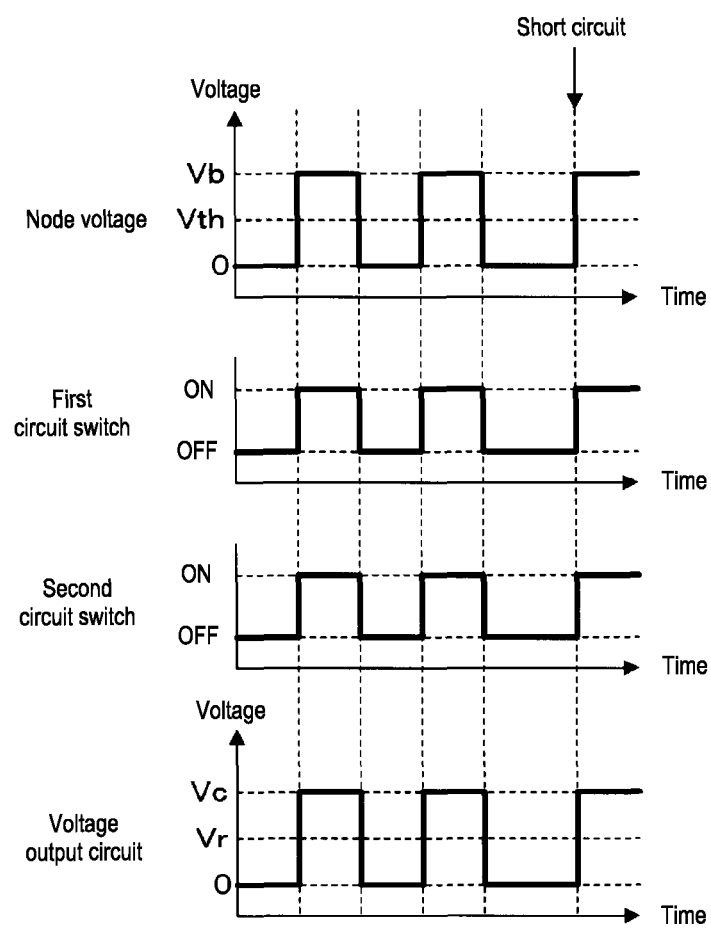
FIG. 6 is a timing chart illustrating an operation of a voltage output circuit.

FIG. 6 is a timing chart illustrating an operation of the voltage output circuit 24. FIG. 6 shows graphs of the node voltage, the state of the first circuit switch 55, the state of the second circuit switch 56, and the output voltage of the voltage output circuit 24. The horizontal axes indicate time in these graphs.

When the node voltage becomes greater than zero, current flows through the circuit resistors 50 and 51 in that order. In the circuit resistor 51, the voltage drops. In the first circuit switch 55, the voltage at the base with respect to the potential of the emitter matches the width of the voltage drop at the circuit resistor 51. The higher the node voltage, the larger the current that flows through the circuit resistor 51, i.e., the larger the width of the voltage drop. The threshold voltage Vth is a node voltage when the voltage at the base of the first circuit switch 55 with respect to the potential of the emitter is a positive constant voltage at the first circuit switch 55. The threshold voltage Vth is greater than 0 V and below the battery voltage Vb.

When the first semiconductor switch 20a and the second semiconductor switch 20b are off, the node voltage is 0 V and below the threshold voltage Vth. When the node voltage is below the threshold voltage Vth, the voltage at the base of the first circuit switch 55 with respect to the potential of the emitter is below the positive constant voltage. Accordingly, the first circuit switch 55 is off.

When the first circuit switch 55 is off, current does not flow through the circuit resistors 53 and 52, and thus, in the second circuit switch 56, the voltage at the base with respect to the potential of the emitter is 0 V and greater than or equal to the positive constant voltage. Accordingly, the second circuit switch 56 is also off. When the second circuit switch 56 is off, current does not flow through the circuit resistor 54, and thus the voltage output circuit 24 outputs 0 V to the OR circuit 23. 0 V is below the reference voltage Vr. Accordingly, when the node voltage is 0 V, the voltage output circuit 24 outputs a voltage below the reference voltage Vr as in Embodiment 1.

When the first semiconductor switch 20a and the second semiconductor switch 20b are on or when the first semiconductor switch 20a is off and a short circuit occurs between the drain and the source of the second semiconductor switch 20b, the node voltage matches the battery voltage Vb or a value close to the battery voltage Vb, and is greater than or equal to the threshold voltage Vth. At this time, in the first circuit switch 55, the voltage at the base with respect to the emitter is greater than or equal to the positive constant voltage, and the first circuit switch 55 is on. When the first circuit switch 55 is on, current flows through the circuit resistors 53 and 52 in that order, and the voltage drops at the circuit resistor 53.

At this time, in the second circuit switch 56, the voltage at the base with respect to the emitter is below the negative constant voltage, and the second circuit switch 56 is on. When the second circuit switch 56 is on, the voltage output circuit 24 outputs the constant voltage Vc to the OR circuit 23. The constant voltage Vc is greater than or equal to the reference voltage Vr at the OR circuit 23. Accordingly, when the node voltage matches the battery voltage Vb or a value close to the battery voltage Vb, the voltage output circuit 24 outputs a voltage greater than or equal to the reference voltage as in Embodiment 1.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is 0 V and below the threshold voltage Vth, and thus the first circuit switch 55 and the second circuit switch 56 are off, and the voltage output circuit 24 outputs 0 V. Accordingly, in a state in which the first semiconductor switch 20a and the second semiconductor switch 20b are off, current does not flow from the battery 12, irrespective of whether or not the connection of the battery 12 is the normal connection.

As described above, the voltage output circuit 24 in Embodiment 2 operates in a way similar to that of the voltage output circuit 24 in Embodiment 1. Accordingly, the power supply control device 10 in Embodiment 2 achieves effects similar to those achieved by the power supply control device 10 in Embodiment 1.

Embodiment 3

The configuration of the voltage output circuit 24 is not limited to those shown in Embodiments 1 and 2.

In the description below, Embodiment 3 will be described focusing on aspects different from those in Embodiment 1. The aspects of the configuration are similar to those in Embodiment 1 except for the aspects described below. Accordingly, constituent elements similar to those in Embodiment 1 are denoted by the same reference numerals as those in Embodiment 1, and their description has been omitted.

Configuration of Voltage Output Circuit 24

Figure 7:
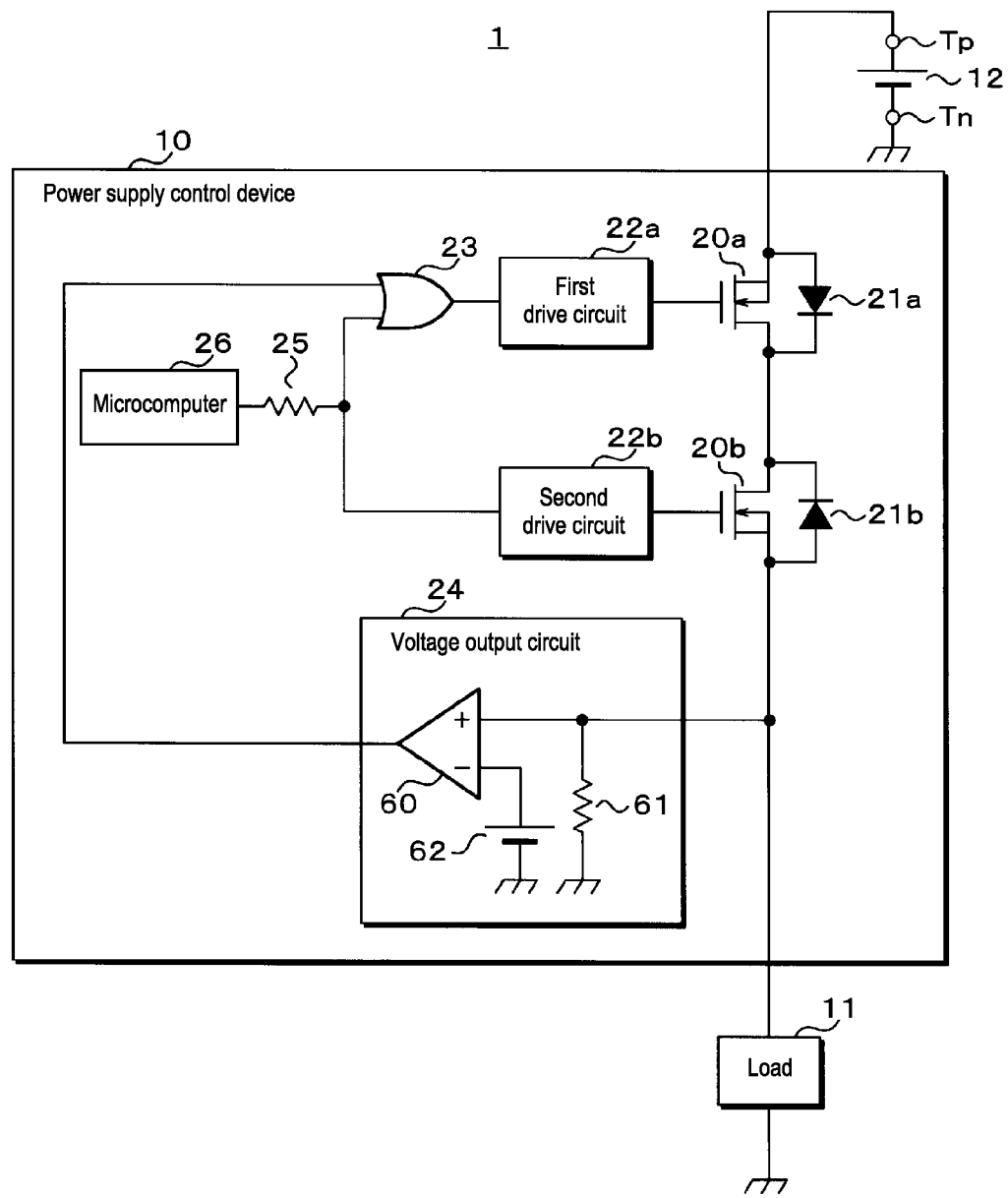
FIG. 7 is a block diagram showing the main configuration of a power source system in Embodiment 3.

FIG. 7 is a block diagram showing the main configuration of the power source system 1 in Embodiment 3. Embodiment 3 is different from Embodiment 1 in the configuration of the voltage output circuit 24. In Embodiment 3, the voltage output circuit 24 includes a comparator 60, a circuit resistor 61, and a DC power source 62. The comparator 60 has a positive terminal, a negative terminal, and an output terminal.

The positive terminal of the comparator 60 is connected to the connection node between the source of the second semiconductor switch 20b and the one end of the load 11 and to one end of the circuit resistor 61. The negative terminal of the comparator 60 is connected to a positive electrode of the DC power source 62. The other end of the circuit resistor 61 and a negative electrode of the DC power source 62 are grounded. The output terminal of the comparator 60 is connected to the one input terminal of the OR circuit 23.

The voltage at the positive electrode of the DC power source 62 with respect to the potential of the ground has a fixed value, and functions as the threshold voltage Vth. The comparator 60 outputs a high-level voltage to the OR circuit 23 when the voltage at the positive terminal with respect to the potential of the ground, that is, the node voltage is greater than or equal to the threshold voltage Vth. The high-level voltage that is output by the comparator 60 is greater than or equal to the reference voltage of the OR circuit 23. The comparator 60 outputs a low-level voltage to the OR circuit 23 when the node voltage is below the threshold voltage. The low-level voltage that is output by the comparator 60 is below the reference voltage of the OR circuit 23.

Operation of Voltage Output Circuit 24

Figure 8:
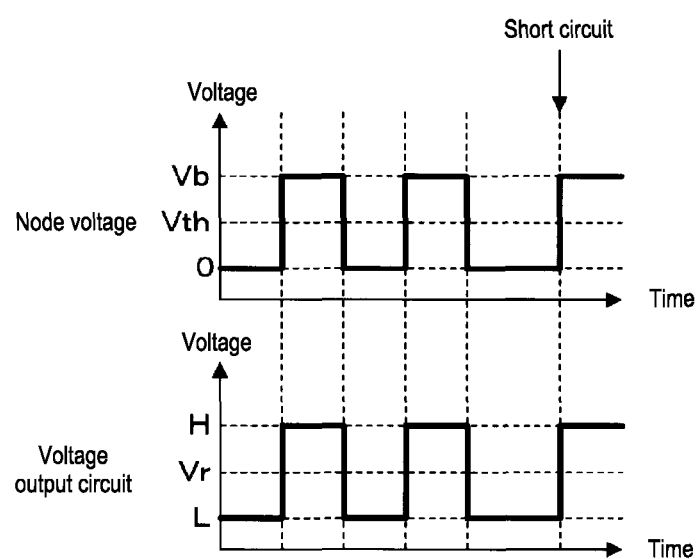
FIG. 8 is a timing chart illustrating an operation of a voltage output circuit.

FIG. 8 is a timing chart illustrating an operation of the voltage output circuit 24. FIG. 8 shows graphs of the node voltage and the output voltage of the voltage output circuit 24. The horizontal axes indicate time in these graphs.

When the first semiconductor switch 20a and the second semiconductor switch 20b are off, the node voltage is 0 V. When the node voltage is 0 V, the comparator 60, that is, the voltage output circuit 24 outputs a voltage below the reference voltage Vr as in Embodiment 1.

When the first semiconductor switch 20a and the second semiconductor switch 20b are on or when the first semiconductor switch 20a is off and a short circuit occurs between the drain and the source of the second semiconductor switch 20b, the node voltage matches the battery voltage Vb or a value close to the battery voltage Vb. At this time, the comparator 60 outputs a high-level voltage. Accordingly, when the node voltage matches the battery voltage Vb or a value close to the battery voltage Vb, the voltage output circuit 24 outputs a voltage greater than or equal to the reference voltage as in Embodiment 1.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the other end of the circuit resistor 61 is grounded, and thus the node voltage is 0 V. When the node voltage is 0 V, the comparator 60, that is, the voltage output circuit 24 outputs a low-level voltage. Accordingly, in a state in which the first semiconductor switch 20a and the second semiconductor switch 20b are off, current does not flow from the battery 12, irrespective of whether or not the connection of the battery 12 is the normal connection.

As described above, the voltage output circuit 24 in Embodiment 3 operates in a way similar to that of the voltage output circuit 24 in Embodiment 1. Accordingly, the power supply control device 10 in Embodiment 3 achieves effects similar to those achieved by the power supply control device 10 in Embodiment 1.

Embodiment 4

In Embodiment 1, whether or not the node voltage is greater than or equal to the threshold voltage is determined by the OR circuit 23. However, the device that performs this determination is not limited to the OR circuit 23.

In the description below, Embodiment 4 will be described focusing on aspects different from those in Embodiment 1.

The aspects of the configuration are similar to those in Embodiment 1 except for the aspects described below. Accordingly, constituent elements similar to those in Embodiment 1 are denoted by the same reference numerals as those in Embodiment 1, and their description has been omitted.

Figure 9:
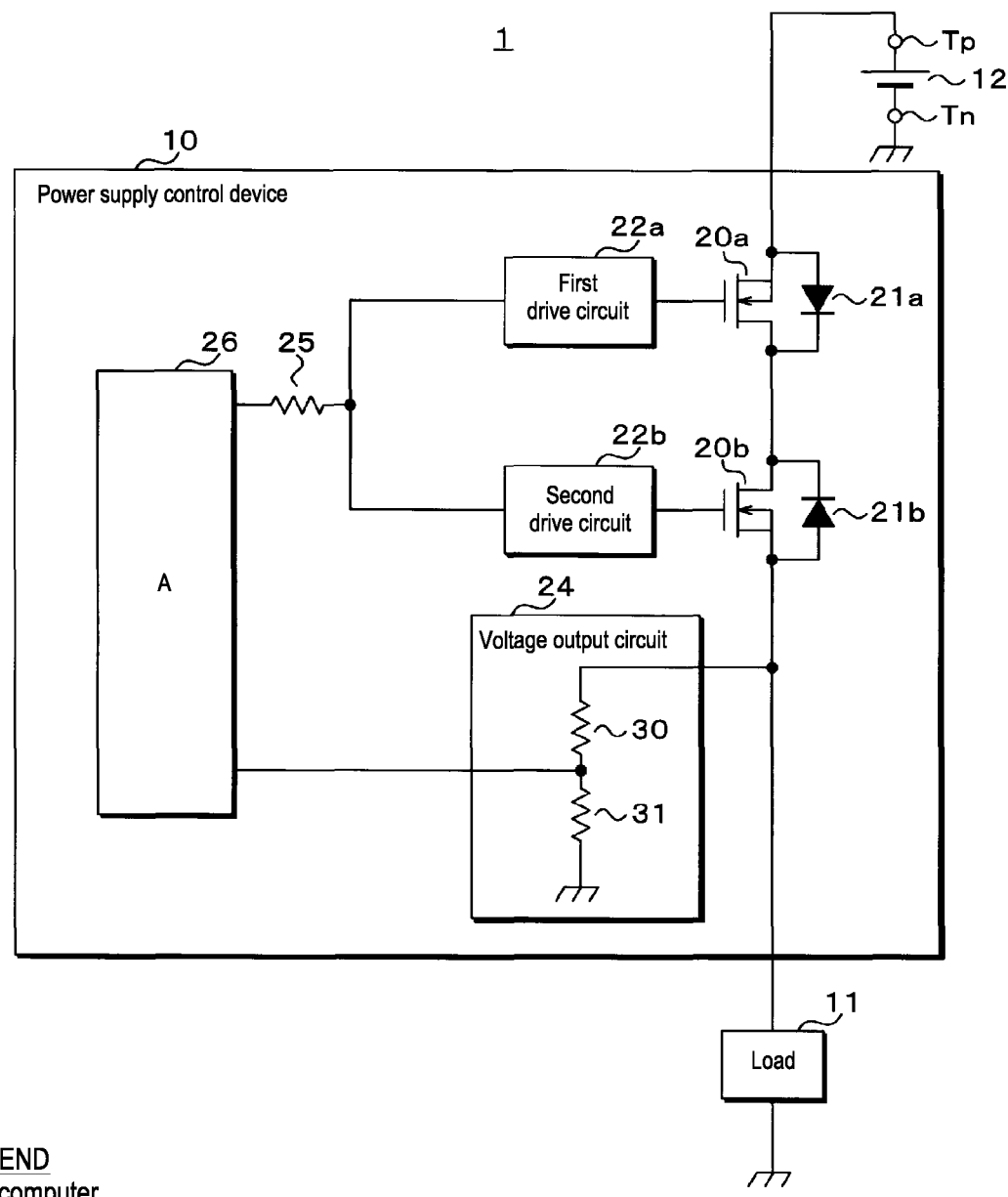
FIG. 9 is a block diagram showing the main configuration of a power source system in Embodiment 4.

FIG. 9 is a block diagram showing the main configuration of the power source system 1 in Embodiment 4. The power supply control device 10 in Embodiment 4 includes the constituent elements of the power supply control device 10 in Embodiment 1 except for the OR circuit 23. In Embodiment 4, the connection node between the circuit resistors 30 and 31 in the voltage output circuit 24 is connected to the microcomputer 26. The microcomputer 26 is connected via the device resistor 25 to the first drive circuit 22a and the second drive circuit 22b.

An output voltage of the voltage output circuit 24 is input to the microcomputer 26. The microcomputer 26 outputs a high-level voltage or a low-level voltage to the first drive circuit 22a and the second drive circuit 22b. When the voltage input from the microcomputer 26 is switched from the low-level voltage to the high-level voltage, the first drive circuit 22a switches the first semiconductor switch 20a on. When the voltage input from the microcomputer 26 is switched from the high-level voltage to the low-level voltage, the first drive circuit 22a switches the first semiconductor switch 20a off.

When the output voltage of the microcomputer 26 is switched to the high-level voltage, the first drive circuit 22a and the second drive circuit 22b switch the first semiconductor switch 20a and the second semiconductor switch 20b on as in Embodiment 1. When the output voltage of the microcomputer 26 is switched to the low-level voltage, the first drive circuit 22a and the second drive circuit 22b switch the first semiconductor switch 20a and the second semiconductor switch 20b off, irrespective of the output voltage of the voltage output circuit 24.

Configuration of Microcomputer 26

Figure 10:
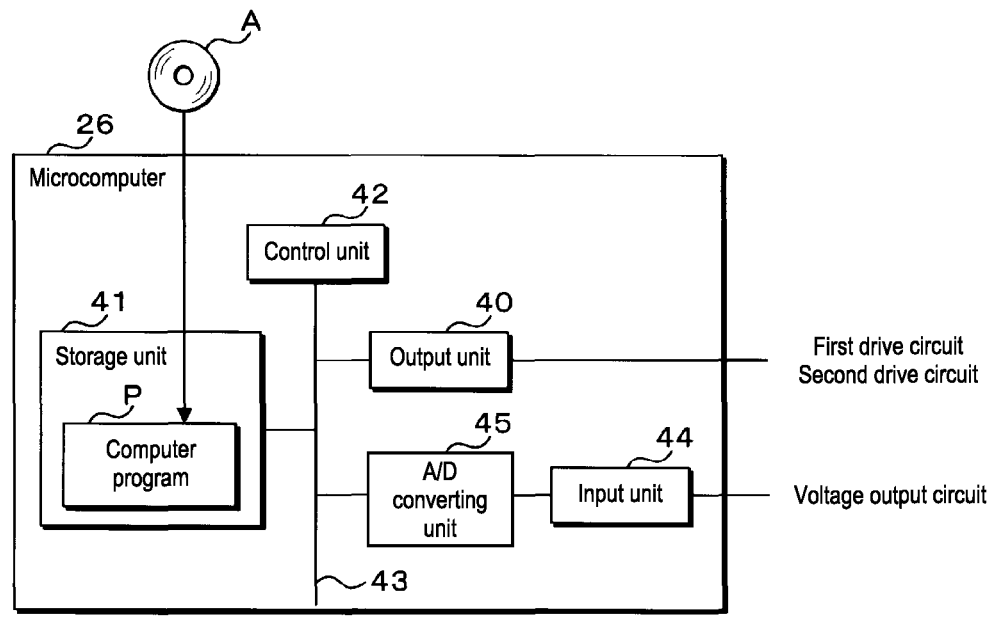
FIG. 10 is a block diagram showing the main configuration of a microcomputer.

FIG. 10 is a block diagram showing the main configuration of the microcomputer 26. The microcomputer 26 in Embodiment 4 includes an input unit 44 and an A/D converting unit 45 in addition to the constituent elements of the microcomputer 26 in Embodiment 1. The output unit 40 is connected to the internal bus 43 and is further connected via the device resistor 25 to the first drive circuit 22a and the second drive circuit 22b. The A/D converting unit 45 is connected to the internal bus 43 and the input unit 44. The input unit 44 is further connected to the connection node between the circuit resistors 30 and 31 included in the voltage output circuit 24.

The output unit 40 outputs a high-level voltage or a low-level voltage via the device resistor 25 to the first drive circuit 22a and the second drive circuit 22b. The output unit 40 switches the output voltages to the first drive circuit 22a and the second drive circuit 22b to the high-level voltage or the low-level voltage according to an instruction from the control unit 42.

The voltage output circuit 24 outputs an analog voltage to the input unit 44. When the analog voltage is input, the input unit 44 outputs the input analog voltage to the A/D converting unit 45. The A/D converting unit 45 converts the analog voltage input from the input unit 44 to a digital voltage. The control unit 42 acquires the digital voltage converted by the A/D converting unit 45, from the A/D converting unit 45. The voltage that is acquired by the control unit 42 substantially matches the voltage that is output by the voltage output circuit 24 when it is acquired.

The processing element of the control unit 42 executes the computer program P, thereby performing short-circuit detecting processing that detects a short circuit between the drain and the source of the second semiconductor switch 20b in addition to the power supply control processing.

Short-Circuit Detecting Processing

Figure 11:
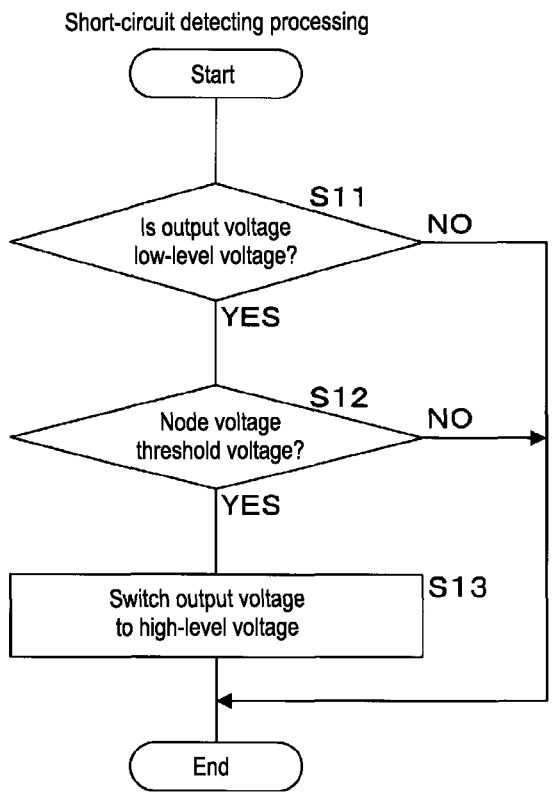
FIG. 11 is a flowchart showing the procedure of short-circuit detecting processing.

FIG. 11 is a flowchart showing the procedure of short-circuit detecting processing. The control unit 42 determines whether or not the output voltage of the output unit 40 is the low-level voltage (step S11). As described in Embodiment 1, the output voltage of the output unit 40 being the low-level voltage means that the control unit 42 has given an instruction to switch the first semiconductor switch 20a and the second semiconductor switch 20b off.

If it is determined that the output voltage is the low-level voltage (S11: YES), the control unit 42 determines whether or not the node voltage is greater than or equal to the threshold voltage (step S12). In step S12, if the output voltage of the voltage output circuit 24 is greater than or equal to the reference voltage Vr, the control unit 42 determines that the node voltage is greater than or equal to the threshold voltage. If the output voltage of the voltage output circuit 24 is below the reference voltage Vr, it is determined that the node voltage is below the threshold voltage.

If it is determined that the output voltage is not the low-level voltage (S11: NO) or if it is determined that the node voltage is below the threshold voltage (S12: NO), the control unit 42 ends the short-circuit detecting processing. After ending the short-circuit detecting processing, the control unit 42 again performs the short-circuit detecting processing. Accordingly, the control unit waits until the node voltage becomes greater than or equal to the threshold voltage in a state in which the output voltage is the low-level voltage.

If it is determined that the node voltage is greater than or equal to the threshold voltage (S12: YES), a short circuit is deemed to have occurred between the drain and the source of the second semiconductor switch 20b, and the control unit 42 instructs the output unit 40 to switch the output voltages to the first drive circuit 22a and the second drive circuit 22b to the high-level voltage (step S13). Accordingly, the first drive circuit 22a switches the first semiconductor switch 20a on. The control unit 42 performs step S13, thereby instructing the first drive circuit 22a to switch the first semiconductor switch 20a on.

After performing step S13, the control unit 42 ends the short-circuit detecting processing and again performs the short-circuit detecting processing.

As described above, in the power supply control device 10 in Embodiment 4 as well, if the node voltage is greater than or equal to the threshold voltage even though the control unit 42 has given an instruction to switch the first semiconductor switch 20a and the second semiconductor switch 20b off, then the first drive circuit 22a switches the first semiconductor switch 20a on as in Embodiment 1. The power supply control device in Embodiment 4 achieves effects similar to those achieved by the power supply control device 10 in Embodiment 1.

Embodiment 5

In Embodiment 1, the first semiconductor switch 20a is arranged upstream of the second semiconductor switch 20b. The arrangement of the first semiconductor switch 20a and the second semiconductor switch 20b is not limited to this.

In the description below, Embodiment 5 will be described focusing on aspects different from those in Embodiment 1. The aspects of the configuration are similar to those in Embodiment 1 except for the aspects described below. Accordingly, constituent elements similar to those in Embodiment 1 are denoted by the same reference numerals as those in Embodiment 1, and their description has been omitted.

Configuration of Power Supply Control Device 10

Figure 12:
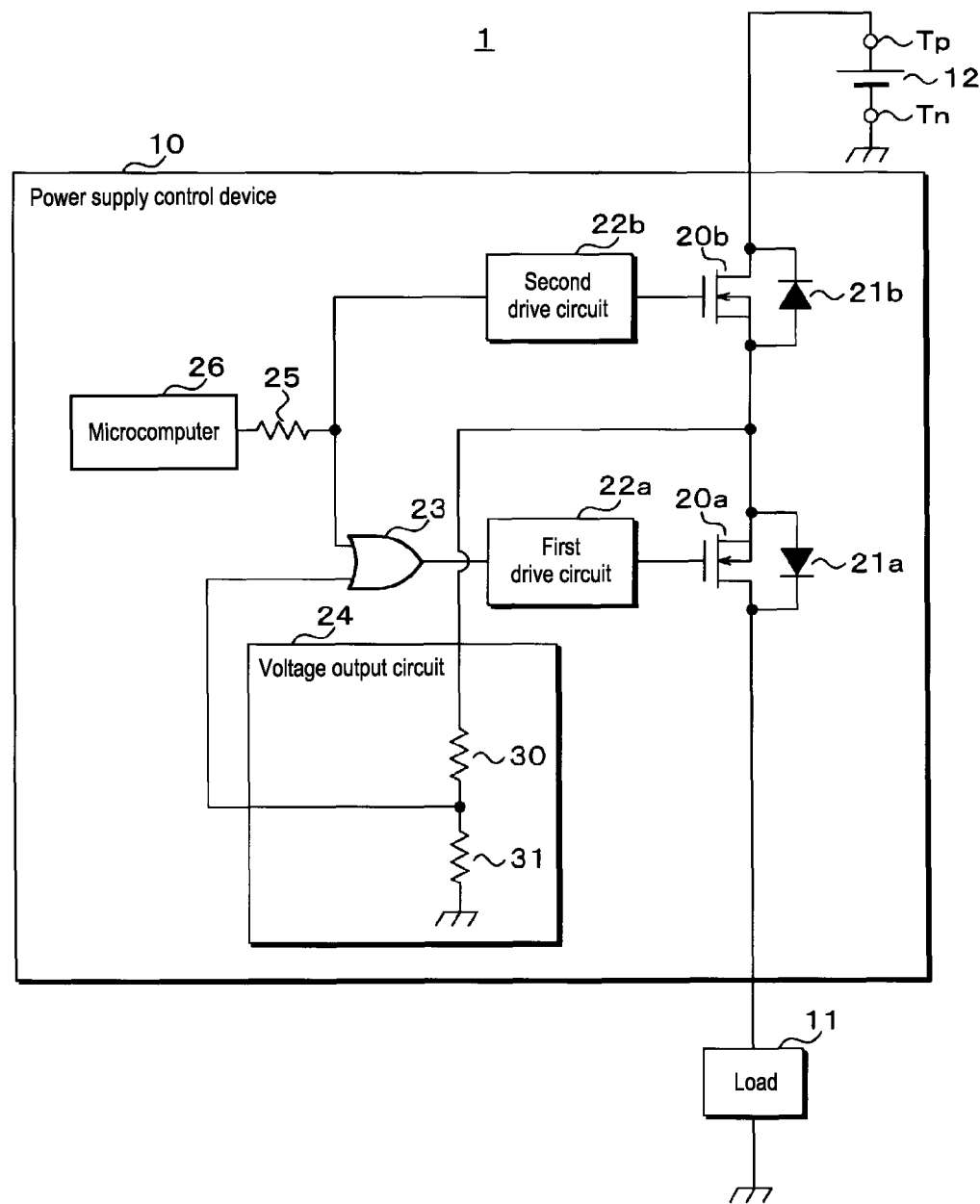
FIG. 12 is a block diagram showing the main configuration of a power source system in Embodiment 5.

FIG. 12 is a block diagram showing the main configuration of the power source system 1 in Embodiment 5. Embodiment 5 is different from Embodiment 1 in the arrangement of the first semiconductor switch 20a and the second semiconductor switch 20b. In the power supply control device 10 in Embodiment 5, the drain of the second semiconductor switch 20b is connected to the positive electrode terminal Tp. The source of the second semiconductor switch 20b is connected to the source of the first semiconductor switch 20a. The drain of the first semiconductor switch 20a is connected to the one end of the load 11.

If the connection of the battery 12 is the normal connection, when the first semiconductor switch 20a and the second semiconductor switch 20b are on, current flows through the positive electrode terminal Tp, the second semiconductor switch 20b, the first semiconductor switch 20a, the load 11, and the negative electrode terminal Tn in that order. The second semiconductor switch 20b, the first semiconductor switch 20a, and the load 11 are arranged in this order on the current path of current that flows from the positive electrode terminal Tp to the negative electrode terminal Tn.

The one end of the circuit resistor 30 of the voltage output circuit 24 is connected to the connection node between the sources of the first semiconductor switch 20a and the second semiconductor switch 20b. The node voltage in Embodiment 5 is a voltage, with respect to the potential of the ground, that is applied to the connection node between the sources of the first semiconductor switch 20a and the second semiconductor switch 20b.

If the connection of the battery 12 is the normal connection, it is assumed that the first semiconductor switch 20a is off and a short circuit occurs between the drain and the source of the second semiconductor switch 20b. In this case, current flows through the positive electrode terminal Tp, the second semiconductor switch 20b, the first diode 21a of the first semiconductor switch 20a, the load 11, and the negative electrode terminal Tn in that order.

When the first semiconductor switch 20a and the second semiconductor switch 20b are off, the node voltage is 0 V as in Embodiment 1. When the first semiconductor switch 20a and the second semiconductor switch 20b are on or when the first semiconductor switch 20a is off and a short circuit occurs between the drain and the source of the second semiconductor switch 20b, the node voltage matches the battery voltage Vb or a value close to the battery voltage Vb as in Embodiment 1.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is 0 V as in Embodiment 1.

Accordingly, the power supply control device 10 in Embodiment 5 achieves effects similar to those achieved by the power supply control device 10 in Embodiment 1.

In Embodiment 5, the configuration of the voltage output circuit 24 is not limited to that using the circuit resistors 30 and 31, and may also be one of the configurations of the voltage output circuit 24 in Embodiments 2 and 3.

Embodiment 6

In Embodiment 5, the node voltage is not limited to a voltage, with respect to the potential of the ground, that is applied to the connection node between the sources of the first semiconductor switch 20a and the second semiconductor switch 20b.

In the description below, Embodiment 6 will be described focusing on aspects different from those in Embodiment 5. The aspects of the configuration are similar to those in Embodiment 5 except for the aspects described below. Accordingly, constituent elements similar to those in Embodiment 5 are denoted by the same reference numerals as those in Embodiment 5, and their description has been omitted.

Configuration of Power Supply Control Device 10

Figure 13:
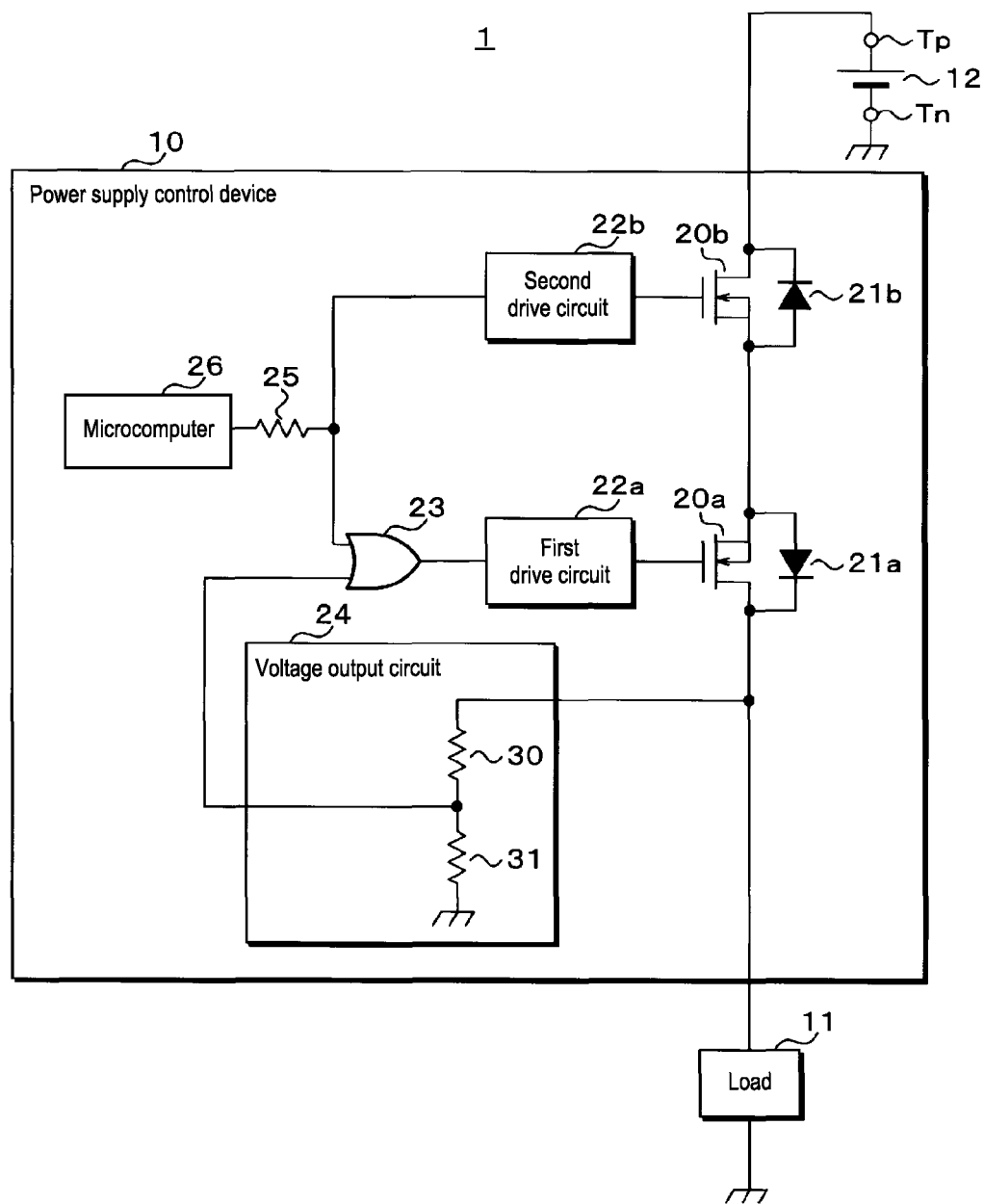
FIG. 13 is a block diagram showing the main configuration of a power source system in Embodiment 6.

FIG. 13 is a block diagram showing the main configuration of the power source system 1 in Embodiment 6. Embodiment 6 is different from Embodiment 5 in the connection node to which the voltage output circuit 24 is connected. As described in Embodiment 5, the configuration of the voltage output circuit 24 is not limited to that using the circuit resistors 30 and 31, and may also be one of the configurations of the voltage output circuit 24 in Embodiments 2 and 3.

FIG. 13 shows an example in which the configuration of the voltage output circuit 24 is that using the circuit resistors 30 and 31 in Embodiment 1. In this case, the one end of the circuit resistor 30 is connected to the connection node between the drain of the first semiconductor switch 20a and the one end of the load 11. In Embodiment 6, the node voltage is a voltage, with respect to the potential of the ground, that is applied to the connection node between the drain of the first semiconductor switch 20a and the one end of the load 11.

When the first semiconductor switch 20a and the second semiconductor switch 20b are off, the node voltage is 0 V as in Embodiment 5. When the first semiconductor switch 20a and the second semiconductor switch 20b are on or when the first semiconductor switch 20a is off and a short circuit occurs between the drain and the source of the second semiconductor switch 20b, the node voltage matches the battery voltage Vb or a value close to the battery voltage Vb as in Embodiment 5.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is 0 V as in Embodiment 5.

Accordingly, the power supply control device 10 in Embodiment 6 achieves effects similar to those achieved by the power supply control device 10 in Embodiment 5.

Embodiment 7

In Embodiment 4, the first semiconductor switch 20a is arranged upstream of the second semiconductor switch 20b. The arrangement of the first semiconductor switch 20a and the second semiconductor switch 20b is not limited to this.

In the description below, Embodiment 7 will be described focusing on aspects different from those in Embodiment 4. The aspects of the configuration are similar to those in Embodiment 4 except for the aspects described below. Accordingly, constituent elements similar to those in Embodiment 4 are denoted by the same reference numerals as those in Embodiment 4, and their description has been omitted.

Configuration of Power Supply Control Device 10

Figure 14:
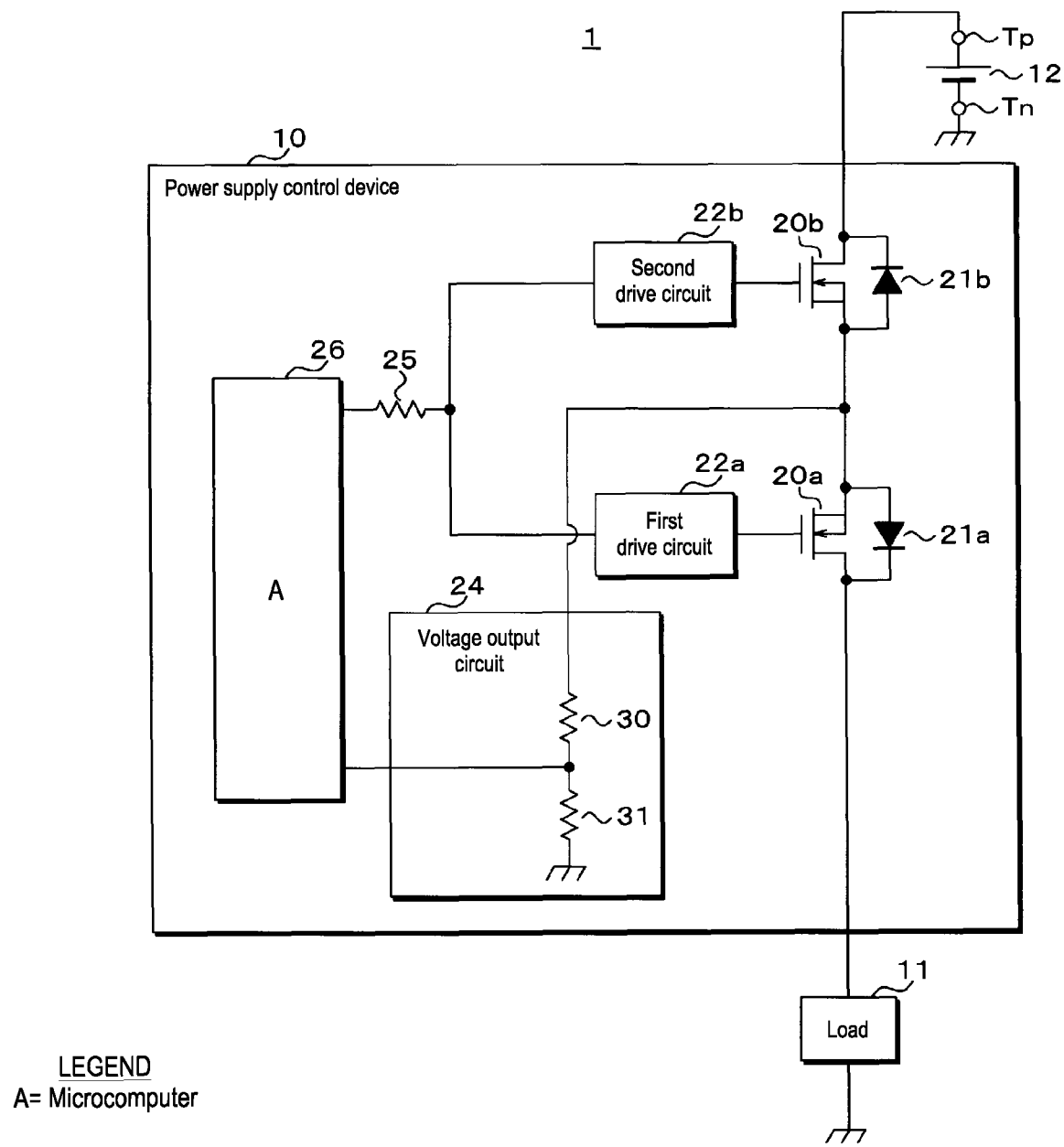
FIG. 14 is a block diagram showing the main configuration of a power source system in Embodiment 7.

FIG. 14 is a block diagram showing the main configuration of the power source system 1 in Embodiment 7. Embodiment 7 is different from Embodiment 4 in the arrangement of the first semiconductor switch 20a and the second semiconductor switch 20b. In the power supply control device 10 in Embodiment 7, the drain of the second semiconductor switch 20b is connected to the positive electrode terminal Tp. The source of the second semiconductor switch 20b is connected to the source of the first semiconductor switch 20a. The drain of the first semiconductor switch 20a is connected to the one end of the load 11.

If the connection of the battery 12 is the normal connection, when the first semiconductor switch 20a and the second semiconductor switch 20b are on, current flows through the positive electrode terminal Tp, the second semiconductor switch 20b, the first semiconductor switch 20a, the load 11, and the negative electrode terminal Tn in that order. The second semiconductor switch 20b, the first semiconductor switch 20a, and the load 11 are arranged in this order on the current path of current that flows from the positive electrode terminal Tp to the negative electrode terminal Tn.

As described in Embodiment 4, the configuration of the voltage output circuit 24 is not limited to that using the circuit resistors 30 and 31, and may also be one of the configurations of the voltage output circuit 24 in Embodiments 2 and 3. FIG. 14 shows an example in which the configuration of the voltage output circuit 24 is that using the circuit resistors 30 and 31 in Embodiment 1. In this example, the one end of the circuit resistor 30 is connected to the connection node between the sources of the first semiconductor switch 20a and the second semiconductor switch 20b. The node voltage in Embodiment 7 is a voltage, with respect to the potential of the ground, that is applied to the connection node between the sources of the first semiconductor switch 20a and the second semiconductor switch 20b.

When the first semiconductor switch 20a and the second semiconductor switch 20b are off, the node voltage is 0 V as in Embodiment 4. When the first semiconductor switch 20a and the second semiconductor switch 20b are on or when the first semiconductor switch 20a is off and a short circuit occurs between the drain and the source of the second semiconductor switch 20b, the node voltage matches the battery voltage Vb or a value close to the battery voltage Vb as in Embodiment 4.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is 0 V as in Embodiment 4. Accordingly, the power supply control device 10 in Embodiment 7 achieves effects similar to those achieved by the power supply control device 10 in Embodiment 4.

Notes

The connection node to which the voltage output circuit 24 is connected may be a connection node between the drain of the first semiconductor switch 20a and the one end of the load 11 as in Embodiment 6. In this case, the node voltage is a voltage, with respect to the potential of the ground, that is applied to the connection node between the drain of the first semiconductor switch 20a and the one end of the load 11.

Embodiment 8

In Embodiment 2, the load 11 is arranged downstream of the power supply control device 10. However, the arrangement of the load 11 is not limited to this.

In the description below, Embodiment 8 will be described focusing on aspects different from those in Embodiment 2. The aspects of the configuration are similar to those in Embodiment 2 except for the aspects described below. Accordingly, constituent elements similar to those in Embodiment 2 are denoted by the same reference numerals as those in Embodiment 2, and their description has been omitted.

Configuration of Power Source System 1

Figure 15:
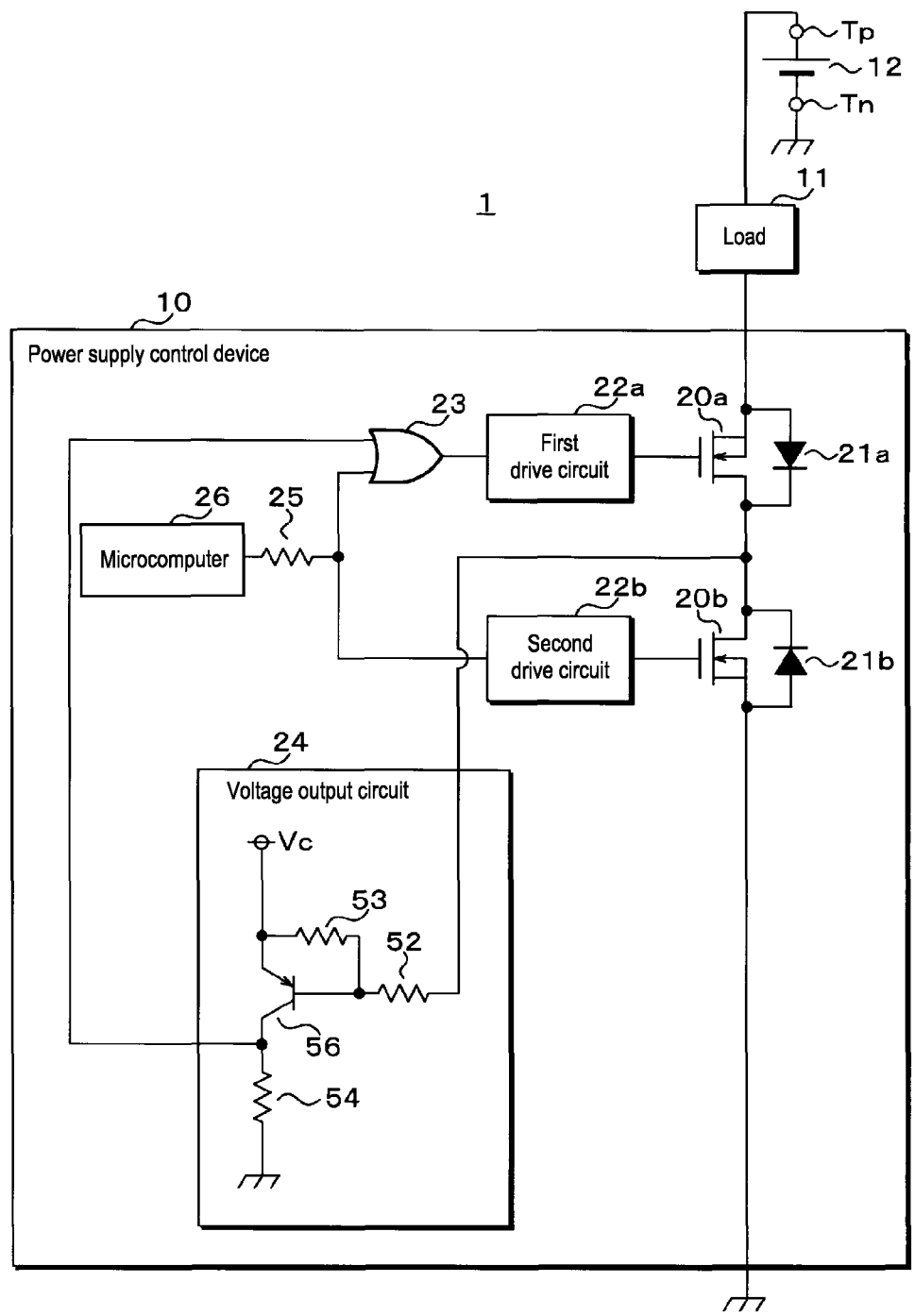
FIG. 15 is a block diagram showing the main configuration of a power source system in Embodiment 8.

FIG. 15 is a block diagram showing the main configuration of the power source system 1 in Embodiment 8. In the power source system 1 in Embodiment 8, the positive electrode terminal Tp is connected to the one end of the load 11. The other end of the load 11 is connected to the source of the first semiconductor switch 20a included in the power supply control device 10. The source of the second semiconductor switch 20b is grounded.

In Embodiment 8, the power supply control device 10 switches the first semiconductor switch 20a and the second semiconductor switch 20b on. Accordingly, the other end of the load 11 and the negative electrode terminal Tn are electrically connected to each other, and power is supplied from the battery 12 to the load 11. The power supply control device 10 switches the first semiconductor switch 20a and the second semiconductor switch 20b off. Accordingly, the other end of the load 11 and the negative electrode terminal Tn are electrically disconnected, and the power supply from the battery 12 to the load 11 is stopped.

Configuration of Power Supply Control Device 10

The power supply control device 10 in Embodiment 8 includes all constituent elements of the power supply control device 10 in Embodiment 2. The first semiconductor switch 20a, the second semiconductor switch 20b, the first drive circuit 22a, the second drive circuit 22b, the OR circuit 23, the device resistor 25, and the microcomputer 26 are connected as in Embodiment 2. The voltage output circuit 24 in Embodiment 8 includes the circuit resistors 52, 53, and 54 and the second circuit switch 56 as in Embodiment 2. They are connected as in Embodiment 2.

The one end of the circuit resistor 52 is connected to the connection node between the drains of the first semiconductor switch 20a and the second semiconductor switch 20b. The constant voltage Vc is applied to the emitter of the second circuit switch 56. The connection node between the collector of the second circuit switch 56 and the one end of the circuit resistor 54 is connected to the one input terminal of the OR circuit 23. The node voltage in Embodiment 8 is a voltage, with respect to the potential of the ground, that is applied to the connection node between the drains of the first semiconductor switch 20a and the second semiconductor switch 20b.

If the connection of the battery 12 is the normal connection, when the first semiconductor switch 20a and the second semiconductor switch 20b are on, current flows from the positive electrode terminal Tp through the load 11, the first semiconductor switch 20a, the second semiconductor switch 20b, and the negative electrode terminal Tn in that order. In this manner, the load 11, the first semiconductor switch 20a, and the second semiconductor switch 20b are arranged in this order on the current path of current that flows from the positive electrode terminal Tp to the negative electrode terminal Tn. In a similar case, it is assumed that the first semiconductor switch 20a is off and a short circuit occurs between the drain and the source of the second semiconductor switch 20b. In this case, current flows through the positive electrode terminal Tp, the load 11, the first diode 21a of the first semiconductor switch 20a, the second semiconductor switch 20b, and the negative electrode terminal Tn in that order.

Operation of Voltage Output Circuit 24

Figure 16:
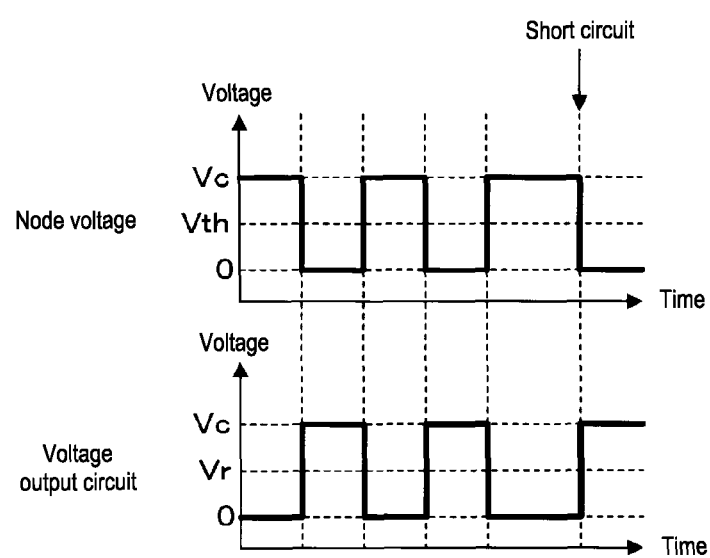
FIG. 16 is a timing chart illustrating an operation of a voltage output circuit.

FIG. 16 is a timing chart illustrating an operation of the voltage output circuit 24. FIG. 16 shows graphs of the node voltage and the output voltage of the voltage output circuit 24. The horizontal axes indicate time in these graphs.

When the node voltage is blow the constant voltage Vc, current flows through the circuit resistors 53 and 52 in that order, and the voltage drops at the circuit resistor 53. At this time, in the second circuit switch 56, the voltage at the base with respect to the potential of the emitter is a negative voltage. The absolute value of the negative voltage matches the width of the voltage drop. The lower the node voltage, the larger the current that flows through the circuit resistor 53, i.e., the larger the width of the voltage drop. The threshold voltage Vth is a node voltage when the voltage at the base of the second circuit switch 56 with respect to the potential of the emitter is a negative constant voltage at the second circuit switch 56. The threshold voltage Vth is greater than 0 V and blow the constant voltage Vc.

In Embodiment 8, when the first semiconductor switch 20a and the second semiconductor switch 20b are off, current does not flow through the circuit resistors 52 and 53, and thus the node voltage is the constant voltage Vc and greater than or equal to the threshold voltage Vth. In this case, the second circuit switch 56 is off, and the voltage output circuit 24 outputs 0 V, which is below the reference voltage Vr, to the OR circuit 23. When the first semiconductor switch 20a and the second semiconductor switch 20b are on or when the first semiconductor switch 20a is off in a state in which a short circuit occurs between the drain and the source of the second semiconductor switch 20b, the node voltage is 0 V and below the threshold voltage Vth. In this case, the second circuit switch 56 is on, and the voltage output circuit 24 outputs the constant voltage Vc, which is greater than or equal to the reference voltage Vr, to the OR circuit 23.

Accordingly, if the node voltage is below the threshold voltage even though the control unit 42 of the microcomputer 26 causes the output unit 40 to output the low-level voltage, a short circuit is deemed to have occurred between the drain and the source of the second semiconductor switch 20b, and the OR circuit 23 switches the output voltage to the high-level voltage. Accordingly, the first drive circuit 22a switches the first semiconductor switch 20a on. The node voltage being below the threshold voltage Vth means that current flows through the current path from the positive electrode terminal Tp to the negative electrode terminal Tn.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is the constant voltage Vc and greater than or equal to the threshold voltage Vth, and thus the second circuit switch 56 is off, and the voltage output circuit 24 outputs 0 V. Accordingly, in a state in which the first semiconductor switch 20a and the second semiconductor switch 20b are off, current does not flow from the battery 12, irrespective of whether or not the connection of the battery 12 is the normal connection.

The power supply control device 10 in Embodiment 8 operates in a way similar to that of the power supply control device 10 in Embodiment 2, and achieves effects similar to those achieved by the power supply control device 10 in Embodiment 2.

Embodiment 9

In Embodiment 8, the node voltage is not limited to a voltage, with respect to the potential of the ground, that is applied to the connection node between the drains of the first semiconductor switch 20a and the second semiconductor switch 20b.

In the description below, Embodiment 9 will be described focusing on aspects different from those in Embodiment 8. The aspects of the configuration are similar to those in Embodiment 8 except for the aspects described below. Accordingly, constituent elements similar to those in Embodiment 8 are denoted by the same reference numerals as those in Embodiment 8, and their description has been omitted.
Configuration of Power Supply Control Device 10

Figure 17:
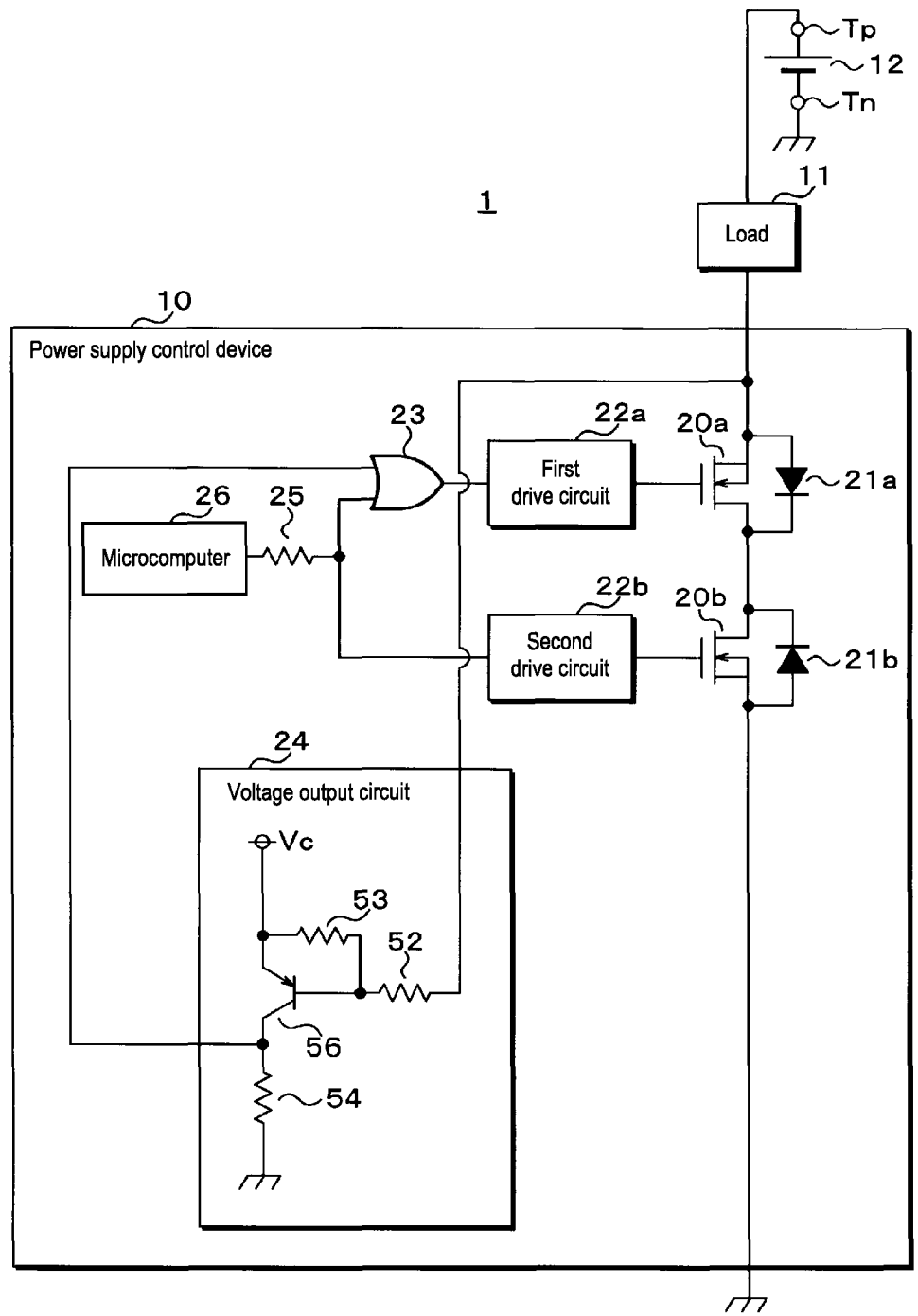
FIG. 17 is a block diagram showing the main configuration of a power source system in Embodiment 9.

FIG. 17 is a block diagram showing the main configuration of the power source system 1 in Embodiment 9. Embodiment 9 is different from Embodiment 8 in the connection node to which the one end of the circuit resistor 52 of the voltage output circuit 24 is connected. The one end of the circuit resistor 52 is connected to the connection node between the other end of the load 11 and the source of the first semiconductor switch 20a. In Embodiment 9, the node voltage is a voltage, with respect to the potential of the ground, that is applied to the connection node between the other end of the load 11 and the source of the first semiconductor switch 20a.

When the first semiconductor switch 20a and the second semiconductor switch 20b are off, the node voltage is the constant voltage Vc and greater than or equal to the threshold voltage Vth as in Embodiment 8. When the first semiconductor switch 20a and the second semiconductor switch 20b are on or when the first semiconductor switch 20a is off and a short circuit occurs between the drain and the source of the second semiconductor switch 20b, the node voltage is 0 V or a value close to 0 V, and is below the threshold voltage Vth as in Embodiment 8.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is the constant voltage Vc and greater than or equal to the threshold voltage Vth as in Embodiment 8.

Accordingly, the power supply control device 10 in Embodiment 9 achieves effects similar to those achieved by the power supply control device 10 in Embodiment 8.

Embodiment 10

In Embodiment 8, whether or not the node voltage is greater than or equal to the threshold voltage is determined by the OR circuit 23. However, the device that performs this determination is not limited to the OR circuit 23. In the description below, Embodiment 10 will be described focusing on aspects different from those in Embodiment 8. The aspects of the configuration are similar to those in Embodiment 8 except for the aspects described below. Accordingly, constituent elements similar to those in Embodiment 8 are denoted by the same reference numerals as those in Embodiment 8, and their description has been omitted.

Figure 18:
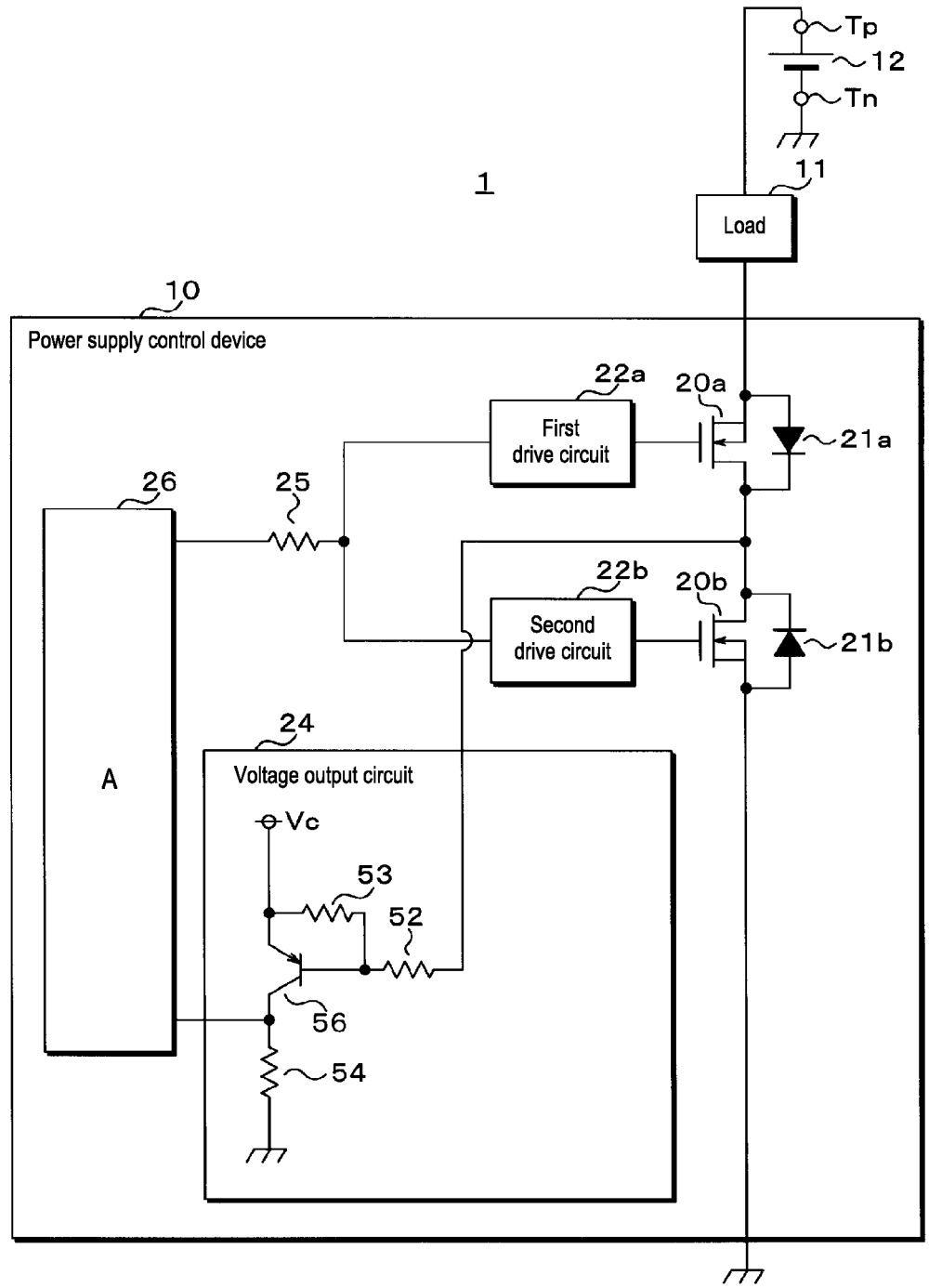
FIG. 18 is a block diagram showing the main configuration of a power source system in Embodiment 10.

FIG. 18 is a block diagram showing the main configuration of the power source system 1 in Embodiment 10. The power supply control device 10 in Embodiment 10 includes the constituent elements of the power supply control device 10 in Embodiment 8 except for the OR circuit 23. The microcomputer 26 in Embodiment 10 has a configuration similar to that of the microcomputer 26 in Embodiment 4. In Embodiment 10, the connection node between the collector of the second circuit switch 56 and the circuit resistor 54 in the voltage output circuit 24 is connected to the input unit 44 of the microcomputer 26. The output unit 40 of the microcomputer 26 is connected via the device resistor 25 to the first drive circuit 22a and the second drive circuit 22b.

The output voltage of the voltage output circuit 24 is input to the input unit 44 of the microcomputer 26. The output unit 40 of the microcomputer 26 outputs a high-level voltage or a low-level voltage to the first drive circuit 22a and the second drive circuit 22b. When the voltage input from the output unit 40 is switched from the low-level voltage to the high-level voltage, the first drive circuit 22a switches the first semiconductor switch 20a on. When the voltage input from the output unit 40 of the microcomputer 26 is switched from the high-level voltage to the low-level voltage, the first drive circuit 22a switches the first semiconductor switch 20a off.

When the output voltage of the output unit 40 is switched to the high-level voltage, the first drive circuit 22a and the second drive circuit 22b switch the first semiconductor switch 20a and the second semiconductor switch 20b on as in Embodiment 8. When the output voltage of the output unit 40 is switched to the low-level voltage, the first drive circuit 22a and the second drive circuit 22b switch the first semiconductor switch 20a and the second semiconductor switch 20b off, irrespective of the output voltage of the voltage output circuit 24.

In Embodiment 10, when the first semiconductor switch 20a and the second semiconductor switch 20b are off, then the voltage output circuit 24 outputs a voltage below the reference voltage Vr as in Embodiment 4. When the first semiconductor switch 20a and the second semiconductor switch 20b are on or when the first semiconductor switch 20a is off in a state in which a short circuit occurs between the drain and the source of the second semiconductor switch 20b, the voltage output circuit 24 outputs a voltage greater than or equal to the reference voltage Vr.

Since the control unit 42 of the microcomputer 26 performs the short-circuit detecting processing as in Embodiment 4, the power supply control device 10 in Embodiment 10 achieves effects similar to those achieved by the power supply control device 10 in Embodiment 4.

In step S12 of the short-circuit detecting processing in Embodiment 10, if the output voltage of the voltage output circuit 24 is below the reference voltage Vr, the control unit 42 determines that the node voltage is greater than or equal to the threshold voltage. If the output voltage of the voltage output circuit 24 is greater than or equal to the reference voltage Vr, the control unit 42 determines that the node voltage is below the threshold voltage. If it is determined that the node voltage is below the threshold voltage (S12: NO), a short circuit is deemed to have occurred between the drain and the source of the second semiconductor switch 20b, and the control unit 42 performs step S13. If it is determined that the node voltage is greater than or equal to the threshold voltage (S12: YES), the control unit 42 ends the short-circuit detecting processing.

Notes

The one end of the circuit resistor 52 of the voltage output circuit 24 may be connected to a connection node between the other end of the load 11 and the source of the first semiconductor switch 20a as in Embodiment 9. In this case, the node voltage is a voltage, with respect to the potential of the ground, that is applied to the connection node between the other end of the load 11 and the source of the first semiconductor switch 20a, as in Embodiment 9.

Embodiment 11

In Embodiment 8, the first semiconductor switch 20a is arranged upstream of the second semiconductor switch 20b. The arrangement of the first semiconductor switch 20a and the second semiconductor switch 20b is not limited to this.

In the description below, Embodiment 11 will be described focusing on aspects different from those in Embodiment 8. The aspects of the configuration are similar to those in Embodiment 8 except for the aspects described below. Accordingly, constituent elements similar to those in Embodiment 8 are denoted by the same reference numerals as those in Embodiment 8, and their description has been omitted.

Configuration of Power Supply Control Device 10

Figure 19:
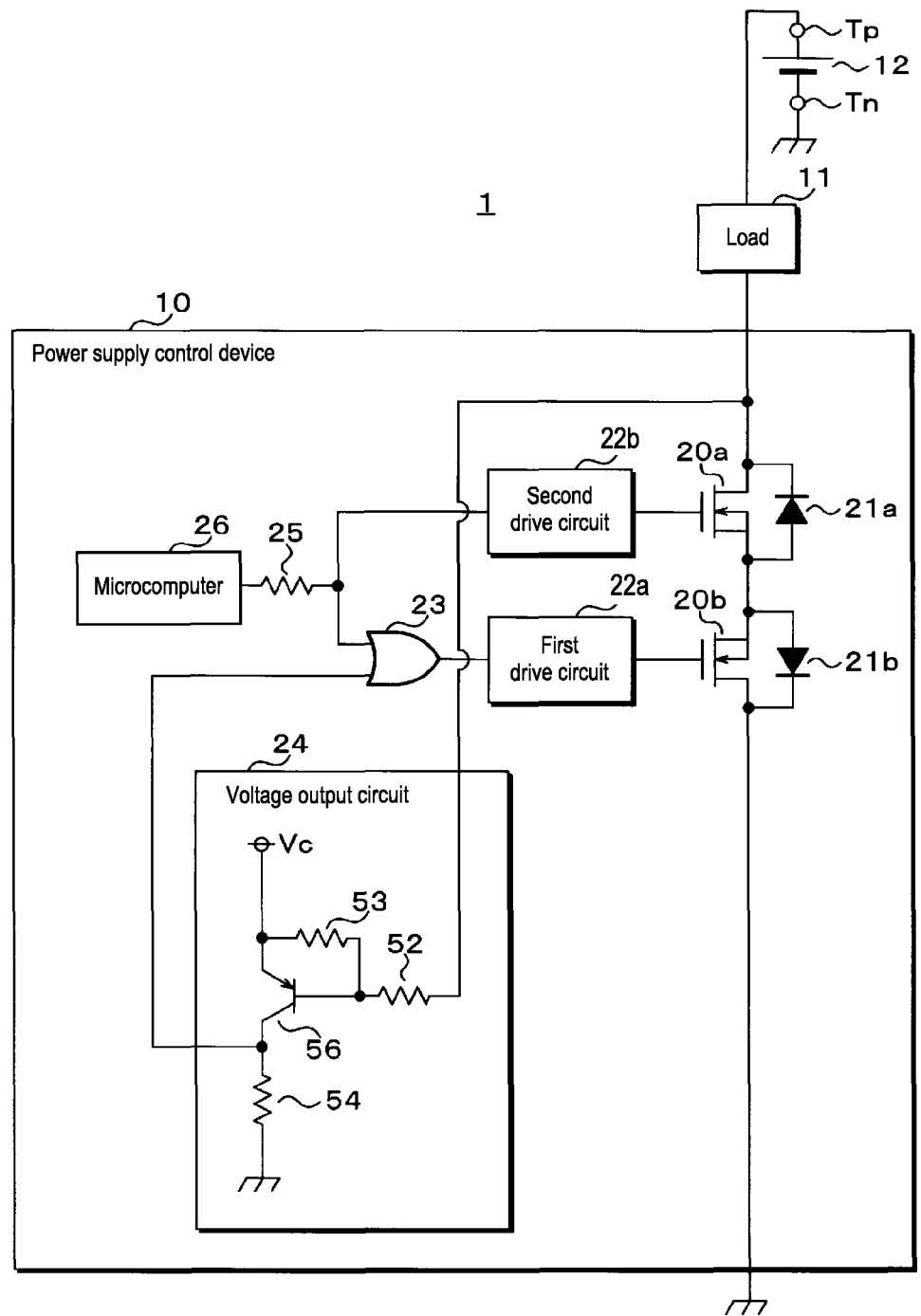
FIG. 19 is a block diagram showing the main configuration of a power source system in Embodiment 11.

FIG. 19 is a block diagram showing the main configuration of the power source system 1 in Embodiment 11. Embodiment 11 is different from Embodiment 8 in the arrangement of the first semiconductor switch 20a and the second semiconductor switch 20b. In the power supply control device 10 in Embodiment 11, the drain of the second semiconductor switch 20b is connected to the other end of the load 11. The source of the second semiconductor switch 20b is connected to the source of the first semiconductor switch 20a. The drain of the first semiconductor switch 20a is grounded.

If the connection of the battery 12 is the normal connection, when the first semiconductor switch 20a and the second semiconductor switch 20b are on, current flows through the positive electrode terminal Tp, the load 11, the second semiconductor switch 20b, the first semiconductor switch 20a, and the negative electrode terminal Tn in that order. The load 11, the second semiconductor switch 20b, and the first semiconductor switch 20a are arranged in this order on the current path of current that flows from the positive electrode terminal Tp to the negative electrode terminal Tn. In a similar case, it is assumed that the first semiconductor switch 20a is off and a short circuit occurs between the drain and the source of the second semiconductor switch 20b. In this case, current flows through the positive electrode terminal Tp, the load 11, the second semiconductor switch 20b, the first diode 21a of the first semiconductor switch 20a, and the negative electrode terminal Tn in that order.

The one end of the circuit resistor 52 of the voltage output circuit 24 is connected to the connection node between the other end of the load 11 and the drain of the first semiconductor switch 20a. The node voltage in Embodiment 11 is a voltage, with respect to the potential of the ground, that is applied to the connection node between the other end of the load 11 and the drain of the first semiconductor switch 20a.

When the first semiconductor switch 20a and the second semiconductor switch 20b are off, the node voltage is the constant voltage Vc and greater than or equal to the threshold voltage Vth as in Embodiment 8. When the first semiconductor switch 20a and the second semiconductor switch 20b are on or when the first semiconductor switch 20a is off and a short circuit occurs between the drain and the source of the second semiconductor switch 20b, the node voltage is 0 V or a value close to 0 V, and is below the threshold voltage Vth as in Embodiment 8.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is the constant voltage Vc and greater than or equal to the threshold voltage Vth as in Embodiment 8.

Accordingly, the power supply control device 10 in Embodiment 11 achieves effects similar to those achieved by the power supply control device 10 in Embodiment 8.

Embodiment 12

In Embodiment 10, the first semiconductor switch 20a is arranged upstream of the second semiconductor switch 20b. The arrangement of the first semiconductor switch 20a and the second semiconductor switch 20b is not limited to this.

In the description below, Embodiment 12 will be described focusing on aspects different from those in Embodiment 10. The aspects of the configuration are similar to those in Embodiment 10 except for the aspects described below. Accordingly, constituent elements similar to those in Embodiment 10 are denoted by the same reference numerals as those in Embodiment 10, and their description has been omitted.

Configuration of Power Supply Control Device 10

Figure 20:
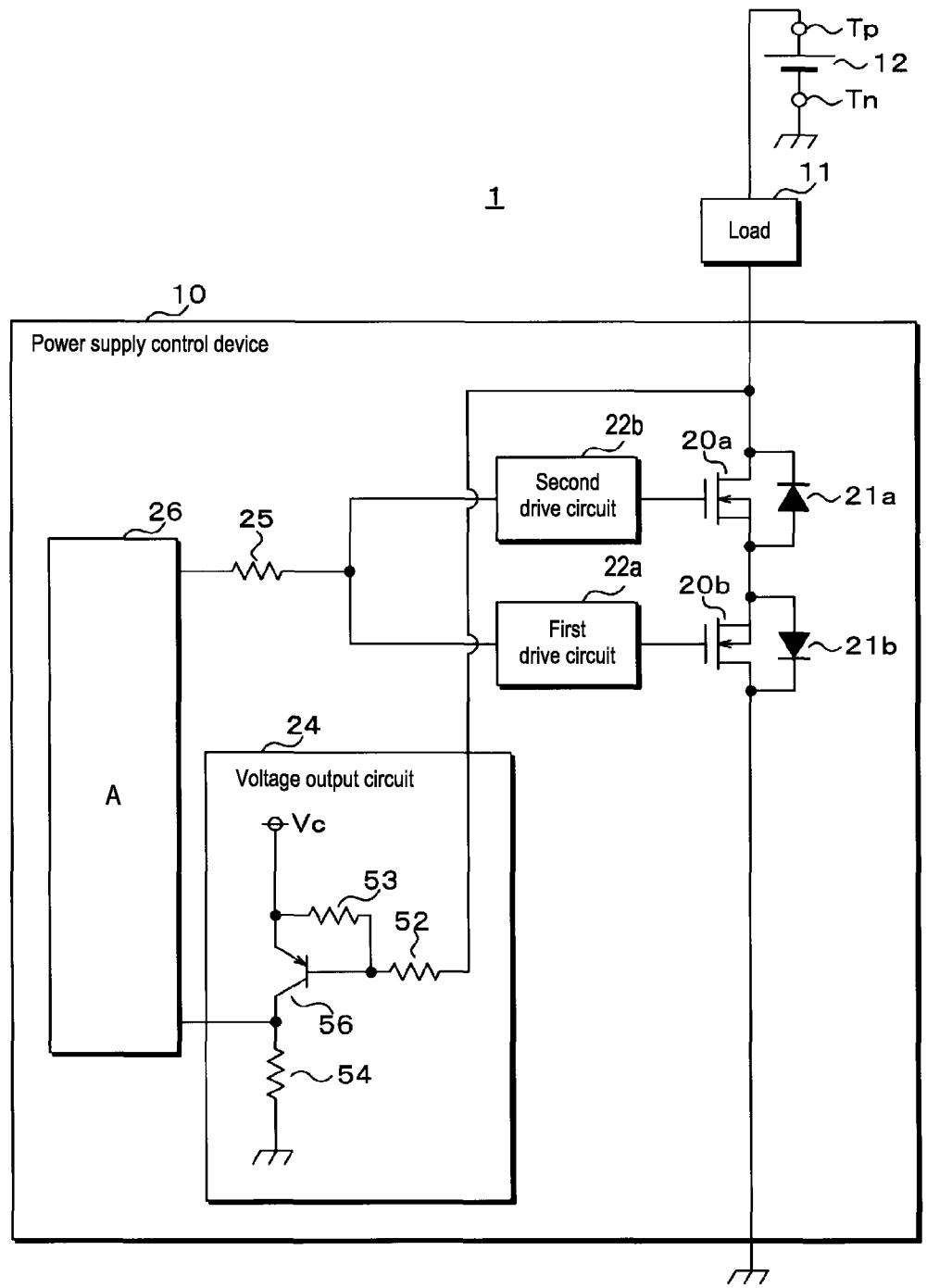
FIG. 20 is a block diagram showing the main configuration of a power source system in Embodiment 12.

FIG. 20 is a block diagram showing the main configuration of the power source system 1 in Embodiment 12. Embodiment 12 is different from Embodiment 10 in the arrangement of the first semiconductor switch 20a and the second semiconductor switch 20b. In the power supply control device 10 in Embodiment 12, the drain of the second semiconductor switch 20b is connected to the other end of the load 11. The source of the second semiconductor switch 20b is connected to the source of the first semiconductor switch 20a. The drain of the first semiconductor switch 20a is grounded.

If the connection of the battery 12 is the normal connection, when the first semiconductor switch 20a and the second semiconductor switch 20b are on, current flows through the positive electrode terminal Tp, the load 11, the second semiconductor switch 20b, the first semiconductor switch 20a, and the negative electrode terminal Tn in that order. The load 11, the second semiconductor switch 20b, and the first semiconductor switch 20a are arranged in this order on the current path of current that flows from the positive electrode terminal Tp to the negative electrode terminal Tn.

If the connection of the battery 12 is the normal connection, it is assumed that the first semiconductor switch 20a is off and a short circuit occurs between the drain and the source of the second semiconductor switch 20b. In this case, current flows through the positive electrode terminal Tp, the load 11, the second semiconductor switch 20b, the first diode 21a of the first semiconductor switch 20a, and the negative electrode terminal Tn in that order.

The one end of the circuit resistor 52 is connected to the connection node between the other end of the load 11 and the drain of the first semiconductor switch 20a. The node voltage in Embodiment 12 is a voltage, with respect to the potential of the ground, that is applied to the connection node between the other end of the load 11 and the drain of the first semiconductor switch 20a.

When the first semiconductor switch 20a and the second semiconductor switch 20b are off, the node voltage is the constant voltage Vc and is greater than or equal to the threshold voltage Vth as in Embodiment 10. When the first semiconductor switch 20a and the second semiconductor switch 20b are on or when the first semiconductor switch 20a is off and a short circuit occurs between the drain and the source of the second semiconductor switch 20b, the node voltage is 0 V or a value close to 0 V, and is below the threshold voltage Vth as in Embodiment 10.

The battery 12 is connected between the positive electrode terminal Tp and the negative electrode terminal Tn in a state in which the first semiconductor switch 20a and the second semiconductor switch 20b are off. At this time, it is assumed that the connection of the battery 12 is the reverse connection. In this case, the node voltage is the constant voltage Vc and is greater than or equal to the threshold voltage Vth as in Embodiment 10.

Accordingly, the power supply control device 10 in Embodiment 12 achieves effects similar to those achieved by the power supply control device 10 in Embodiment 10.

Modified Examples

In Embodiments 1 to 12, it is sufficient that the first semiconductor switch 20a and the second semiconductor switch 20b are semiconductor switches having parasitic diodes, and thus they are not limited to N-channel FETs. The first semiconductor switch 20a may also be a P-channel FET. In this case, the cathode and the anode of the first diode 21a are connected to the source and the drain of the first semiconductor switch 20a.

If the first semiconductor switch 20a is a P-channel FET, the points to which the drain and the source of the first semiconductor switch 20a are respectively connected are changed to the points to which the source and the drain of the first semiconductor switch 20a are connected when the first semiconductor switch 20a is an N-channel FET. The first drive circuit 22a decreases the voltage at the gate of the first semiconductor switch 20a, thereby switching the first semiconductor switch 20a on. The first drive circuit 22a increases the voltage at the gate of the first semiconductor switch 20a, thereby switching the first semiconductor switch 20a off.

In a similar manner, the second semiconductor switch 20b may also be a P-channel FET. In this case as well, the cathode and the anode of the second diode 21b are connected to the source and the drain of the second semiconductor switch 20b. If the second semiconductor switch 20b is a P-channel FET, the points to which the drain and the source of the second semiconductor switch 20b are respectively connected are changed to the points to which the source and the drain of the second semiconductor switch 20b are connected when the second semiconductor switch 20b is an N-channel FET. The second drive circuit 22b decreases the voltage at the gate of the second semiconductor switch 20b, thereby switching the second semiconductor switch 20b on. The second drive circuit 22b increases the voltage at the gate of the second semiconductor switch 20b, thereby switching the second semiconductor switch 20b off.

In Embodiments 1 to 12, the microcomputer 26 is connected via the device resistor 25 to the OR circuit 23 and the second drive circuit 22b or to the first drive circuit 22a and the second drive circuit 22b. If the power supply control device 10 has two device resistors 25, the microcomputer 26 may be connected via one of the device resistors 25 to the OR circuit 23 or the first drive circuit 22a and connected via the other device resistor 25 to the second drive circuit 22b. In this case, the microcomputer 26 outputs a high-level voltage or a low-level voltage to the OR circuit 23 or the first drive circuit 22a and outputs a high-level voltage or a low-level voltage to the second drive circuit 22b. In the configuration in which the microcomputer 26 directly outputs a high-level voltage or a low-level voltage to the first drive circuit 22a, if the output voltage of the voltage output circuit 24 is greater than or equal to the reference voltage Vr, the microcomputer 26 switches the voltage that is output to the first drive circuit 22a to the high-level voltage.

In Embodiments 1 to 3, 5, and 6, the one input terminal of the OR circuit 23 may be connected to a connection node on the current path without being connected via the voltage output circuit 24. In this case, the reference voltage of the voltage that is input to the one input terminal of the OR circuit 23 matches the threshold voltage. In a similar manner, in Embodiments 1 to 3, 5, and 6, the one input terminal of the OR circuit 23 may be connected to a connection node on the current path not via the voltage output circuit 24 but via a diode. In this case as well, the reference voltage of the voltage that is input to the one input terminal of the OR circuit 23 matches the threshold voltage. A cathode of the diode is arranged on the side of the OR circuit 23.

In Embodiments 2 and 5 to 7, it is sufficient that the first circuit switch 55 is a switch that is switched on when the voltage at the control end is greater than or equal to a constant voltage, and thus it is not limited to an NPN bipolar transistor, and may also be, for example, an N-channel FET.

In Embodiments 2 and 5 to 12, it is sufficient that the second circuit switch 56 is a switch that is switched on when the voltage at the control end is below a constant voltage, and thus it is not limited to a PNP bipolar transistor, and may also be, for example, a P-channel FET.

Embodiments 1 to 12 that were disclosed are to be considered exemplary in all respects and in no way limiting. The scope of the present disclosure is defined by the scope of the appended claims and not by the above description, and all changes that fall within the same essential spirit as the scope of the claims are included therein.

The invention claimed is:

1. A power supply control device for controlling a power supply by switching on or off both a first semiconductor switch and a second semiconductor switch that are arranged on a current path and each have two ends between which a parasitic diode is connected, comprising:
    a processing unit configured to perform processing that gives an instruction to switch the first semiconductor switch and the second semiconductor switch on or off; and
    a switching circuit configured to switch the first semiconductor switch on, if current flows through the current path even though the processing unit has given an instruction to switch the first semiconductor switch and the second semiconductor switch off,
    wherein the cathodes of the parasitic diodes of the first semiconductor switch and the second semiconductor switch are located respectively downstream and upstream of the respective anode on the current path.

2. The power supply control device according to claim 1, wherein the first semiconductor switch is arranged upstream of the second semiconductor switch on the current path,
    a load is arranged downstream of the second semiconductor switch on the current path, and if a node voltage at a connection node between the second semiconductor switch and the load is greater than or equal to a threshold voltage even though the processing unit has given an instruction to switch the first semiconductor switch and the second semiconductor switch off, then the switching circuit switches the first semiconductor switch on.

3. The power supply control device according to claim 1, wherein the first semiconductor switch is arranged downstream of the second semiconductor switch on the current path,
   a load is arranged downstream of the first semiconductor switch on the current path, and
   if a node voltage at a connection node between the second semiconductor switch and the load is greater than or equal to a threshold voltage even though the processing unit has given an instruction to switch the first semiconductor switch and the second semiconductor switch off, then the switching circuit switches the first semiconductor switch on.

4. The power supply control device according to claim 2, wherein, if an instruction has been given to switch the first semiconductor switch and the second semiconductor switch off, then the processing unit determines whether or not the node voltage is greater than or equal to the threshold voltage, and
   if it is determined that the node voltage is greater than or equal to the threshold voltage, then the processing unit performs processing that instructs the switching circuit to switch the first semiconductor switch on.

5. The power supply control device according to claim 1, wherein the first semiconductor switch is arranged upstream of the second semiconductor switch on the current path,
   a load is arranged upstream of the first semiconductor switch on the current path, and
   if a node voltage at a connection node between the load and the second semiconductor switch is below a threshold voltage even though the processing unit has given an instruction to switch the first semiconductor switch and the second semiconductor switch off, then the switching circuit switches the first semiconductor switch on.

6. The power supply control device according to claim 1, wherein the first semiconductor switch is arranged downstream of the second semiconductor switch on the current path,
   a load is arranged upstream of the second semiconductor switch on the current path, and
   if a node voltage at a connection node between the load and the second semiconductor switch is below a threshold voltage even though the processing unit has given an instruction to switch the first semiconductor switch and the second semiconductor switch off, then the switching circuit switches the first semiconductor switch on.

7. The power supply control device according to claim 5, wherein, if an instruction has been given to switch the first semiconductor switch and the second semiconductor switch off, then the processing unit determines whether or not the node voltage is below the threshold voltage, and
   if it is determined that the node voltage is below the threshold voltage, then the processing unit performs processing that instructs the switching circuit to switch the first semiconductor switch on.

8. The power supply control device according to claim 3, wherein, if an instruction has been given to switch the first semiconductor switch and the second semiconductor switch off, then the processing unit determines whether or not the node voltage is greater than or equal to the threshold voltage, and
   if it is determined that the node voltage is greater than or equal to the threshold voltage, then the processing unit performs processing that instructs the switching circuit to switch the first semiconductor switch on.

9. The power supply control device according to claim 6, wherein, if an instruction has been given to switch the first semiconductor switch and the second semiconductor switch off, then the processing unit determines whether or not the node voltage is below the threshold voltage, and
   if it is determined that the node voltage is below the threshold voltage, then the processing unit performs processing that instructs the switching circuit to switch the first semiconductor switch on.

* * * * *